(12) United States Patent
Sudo

(10) Patent No.: US 10,678,190 B2
(45) Date of Patent: Jun. 9, 2020

(54) TIME-TO-DIGITAL CONVERTER, CIRCUIT DEVICE, PHYSICAL QUANTITY MEASUREMENT APPARATUS, ELECTRONIC INSTRUMENT, AND VEHICLE

(71) Applicant: Seiko Epson Corporation, Tokyo (JP)

(72) Inventor: Yasuhiro Sudo, Chino (JP)

(73) Assignee: Seiko Epson Corporation (JP)

( * ) Notice: Subject to any disclaimer, the term of this patent is extended or adjusted under 35 U.S.C. 154(b) by 11 days.

(21) Appl. No.: 16/114,533

(22) Filed: Aug. 28, 2018

(65) Prior Publication Data

US 2019/0064749 A1 Feb. 28, 2019

(30) Foreign Application Priority Data

Aug. 29, 2017 (JP) ................. 2017-163935

(51) Int. Cl.
| | |
|---|---|
| G04F 10/00 | (2006.01) |
| B60R 16/023 | (2006.01) |
| H03L 7/07 | (2006.01) |
| H03L 7/099 | (2006.01) |
| H03L 7/08 | (2006.01) |
| H03L 7/093 | (2006.01) |
| H03L 7/23 | (2006.01) |

(52) U.S. Cl.
CPC ........ *G04F 10/005* (2013.01); *B60R 16/0232* (2013.01); *H03L 7/07* (2013.01); *H03L 7/0805* (2013.01); *H03L 7/093* (2013.01); *H03L 7/0992* (2013.01); *H03L 7/0996* (2013.01); *H03L 7/23* (2013.01); *H03L 2207/06* (2013.01)

(58) Field of Classification Search
CPC ..................................... G04F 10/005
USPC .......................................... 331/25
See application file for complete search history.

(56) References Cited

U.S. PATENT DOCUMENTS

2012/0328065 A1* 12/2012 Burg .............. H03L 7/113
375/376
2018/0239307 A1* 8/2018 Tsutsumi ............. G04F 10/005

FOREIGN PATENT DOCUMENTS

JP S64-079687 A 3/1989

* cited by examiner

*Primary Examiner* — Joseph Chang
(74) *Attorney, Agent, or Firm* — Harness, Dickey & Pierce, P.L.C.

(57) ABSTRACT

A time-to-digital converter includes a first oscillation circuit that starts oscillating at the transition timing of a first signal and generates a first clock signal having a first clock frequency, a second oscillation circuit that starts oscillating at the transition timing of a second signal and generates a second clock signal having a second clock frequency, a first adjustment circuit that adjusts the oscillation frequency of the first oscillation circuit based on a reference clock signal, a second adjustment circuit that adjusts the oscillation frequency of the second oscillation circuit based on the reference clock signal, and a processing circuit that converts the time difference between the transition timing of the first signal and the transition timing of the second signal into a digital value based on the first and second clock signals.

20 Claims, 12 Drawing Sheets

TIME-TO-DIGITAL CONVERTER, CIRCUIT DEVICE, PHYSICAL QUANTITY MEASUREMENT APPARATUS, ELECTRONIC INSTRUMENT, AND VEHICLE

BACKGROUND

1. Technical Field

The present invention relates to a time-to-digital converter, a circuit device, a physical quantity measurement apparatus, an electronic instrument, a vehicle, and the like.

2. Related Art

There has been a known time-to-digital converter that converts time into a digital value. As an example of a time-to-digital converter of related art that measures a time difference between a first signal and a second signal produced at arbitrary timings, there is, for example, a related-art technology disclosed in JP-A-64-079687.

JP-A-64-079687 describes a time clocking circuit that includes a first oscillator that starts oscillating at a frequency f when a start signal is produced and a second oscillator that starts oscillating at a frequency f+Δf in when a stop signal is produced and compares the phase of a clock signal from the first oscillator with the phase of a clock signal from the second oscillator to measure the time gap between the start signal and the stop signal.

A time-to-digital converter, such as that described above, is required to have increased performance (increased resolution or accuracy, for example).

For example, in the configuration described in JP-A-64-079687, a ring oscillator is, for example, used as each of the first and second oscillators. Therefore, the characteristics of the clock signal from each of the oscillators (for example, temperature characteristic, process variation, and jitter characteristic) affect the time clocking accuracy, undesirably resulting in insufficient time clocking accuracy in some cases. It is conceivable to use, for example, a quartz crystal oscillator as an oscillator having excellent oscillation characteristics. However, since it is difficult to control the start of a quartz crystal oscillator, it is difficult to start oscillation at the transition timing of the first signal (or second signal).

SUMMARY

An advantage of some aspects of the invention is to solve at least a part of the problems described above, and the invention can be implemented as the following forms or embodiments.

An aspect of the invention relates to a time-to-digital converter including a first oscillation circuit that starts oscillating at a transition timing of a first signal and generates a first clock signal having a first clock frequency, a second oscillation circuit that starts oscillating at a transition timing of a second signal and generates a second clock signal having a second clock frequency different from the first clock frequency, a first adjustment circuit that measures the first clock frequency based on a reference clock signal and adjusts an oscillation frequency of the first oscillation circuit in such a way that the first clock frequency is equal to a first target frequency, a second adjustment circuit that measures the second clock frequency based on the reference clock signal and adjusts an oscillation frequency of the second oscillation circuit in such a way that the second clock frequency is equal to a second target frequency, and a processing circuit that converts a time difference between the transition timing of the first signal and the transition timing of the second signal into a digital value based on the first and second clock signals.

According to the aspect of the invention, based on the reference clock signal, the first clock frequency of the first clock signal is so controlled as to be equal to the first target frequency, and the second clock frequency of the second clock signal is so controlled as to be equal to the second target frequency. The control described above can reduce errors in the first and second clock frequencies resulting from the oscillation characteristics of the first and second oscillation circuits. Since the accuracy of the time measurement is affected by the accuracy of the first and second clock frequencies, a decrease in any error in the first and second clock frequencies allows an increase in accuracy of the time measurement. That is, according to the aspect of the invention, the time difference between the transition timings of the first and second signals inputted externally to the time-to-digital converter (produced at arbitrary timings) can be measured with accuracy.

In the aspect of the invention, the first adjustment circuit may include a first measurement circuit that measures the first clock frequency based on the reference clock signal, a first comparison circuit that compares the first clock frequency measured by the first measurement circuit with the first target frequency, and a first control circuit that outputs first control data that controls the oscillation frequency of the first oscillation circuit based on a result of the comparison performed by the first comparison circuit, and the second adjustment circuit may include a second measurement circuit that measures the second clock frequency based on the reference clock signal, a second comparison circuit that compares the second clock frequency measured by the second measurement circuit with the second target frequency, and a second control circuit that outputs second control data that controls the oscillation frequency of the second oscillation circuit based on a result of the comparison performed by the second comparison circuit.

According to the aspect of the invention with this configuration, the first and second clock frequencies are measured, the measured first and second clock frequencies are compared with the first and second target frequencies, and the first and second control data based on the results of the comparison are outputted to the first and second oscillation circuits. The oscillation frequencies of the first and second oscillation circuits can therefore be so adjusted that the first and second clock frequencies are equal to the first and second target clock frequencies.

In the aspect of the invention, the time-to-digital converter may further include a first selector that selects the first signal or an adjustment enable signal and a second selector that selects the second signal or the adjustment enable signal. In a first mode, the first selector may select the adjustment enable signal and outputs the adjustment enable signal to the first oscillation circuit, the first adjustment circuit may adjust the oscillation frequency of the first oscillation circuit having started oscillating in response to the adjustment enable signal, the second selector may select the adjustment enable signal and outputs the adjustment enable signal to the second oscillation circuit, and the second adjustment circuit may adjust the oscillation frequency of the second oscillation circuit having started oscillating in response to the adjustment enable signal. In a second mode, the first selector may select the first signal and outputs the first signal to the first oscillation circuit, the first oscillation circuit to which the first signal has been inputted may start oscillating at the transition timing of the first signal to generate the first clock signal, the second selector may select the second signal and outputs the second signal to the second oscillation circuit, and the second oscillation circuit to which the second signal has been inputted may start oscillating at the transition timing of the second signal to generate the second clock signal. The processing circuit may convert the time difference into the digital value based on the first and second clock signals.

According to the aspect of the invention with this configuration, when the first and second selectors select the adjustment enable signal in the first mode, the first and second oscillation circuits keep generating the first and second clock signals. On the other hand, when the first and second selectors select the first and second signals in the second mode, the first and second oscillation circuits can start oscillating at the transition timings of the first and second signal. Switching the oscillation frequency adjustment and the time measurement from one to the other with the aid of sequence control as described above allows accurate time measurement in the second mode by using the first and second clock frequencies accurately adjusted in the first mode.

In the aspect of the invention, the time-to-digital converter may further include a reference clock counter that counts the number of clocks of the reference clock signal and outputs an enable signal that becomes active in a count enable period that is a period for which a given number of clocks is counted. The first adjustment circuit may include a first measurement circuit that counts the number of clocks of the first clock signal in the count enable period based on the enable signal and outputs a first clock count, and the second adjustment circuit may include a second measurement circuit that counts the number of clocks of the second clock signal in the count enable period based on the enable signal and outputs a second clock count.

According to the aspect of the invention with this configuration, counting the number of clocks of the first and second clock signals in the count enable period defined based on the reference clock signal allows measurement of the first and second clock frequencies with respect to the frequency of the reference clock signal.

In the aspect of the invention, the first adjustment circuit may include a first comparison circuit that determines a value of a difference between the first clock count and a first target count corresponding to the first target frequency and outputs a first difference value and a first control circuit that includes a first integrator that integrates the first difference value and outputs a first integrated value, and the first control circuit outputting first control data that controls the oscillation frequency of the first oscillation circuit based on the first integrated value, and the second adjustment circuit may include a second comparison circuit that determines a value of a difference between the second clock count and a second target count corresponding to the second target frequency and outputs a second difference value and a second control circuit that includes a second integrator that integrates the second difference value and outputs a second integrated value, and the second control circuit outputting second control data that controls the oscillation frequency of the second oscillation circuit based on the second integrated value.

According to the aspect of the invention with this configuration, the first and second comparison circuits output the first and second difference values, which are the values of the differences between the first and second clock counts and the first and second targets counts, and the first and second control circuits integrate the first and second difference values to generate the first and second control data, whereby feedback control can be so performed on the oscillation frequencies of the first and second oscillation circuits that the first and second clock frequencies are equal to the first and second target frequencies.

In the aspect of the invention, the time-to-digital converter may further include a first replicated oscillation circuit that is a circuit that replicates the first oscillation circuit and generates a first replicated clock signal and a second replicated oscillation circuit that is a circuit that replicates the second oscillation circuit and generates a second replicated clock signal. The first adjustment circuit may measure a frequency of the first replicated clock signal based on the reference clock signal to measure the first clock frequency and adjust an oscillation frequency of the first replicated oscillation circuit in such a way that the frequency of the first replicated clock signal is equal to the first target frequency, and the second adjustment circuit may measure a frequency of the second replicated clock signal based on the reference clock signal to measure the second clock frequency and adjust an oscillation frequency of the second replicated oscillation circuit in such a way that the frequency of the second replicated clock signal is equal to the second target frequency.

Since the first and second replicated oscillation circuits are circuits that replicate the first and second oscillation circuits, adjusting the oscillation frequencies of the first and second replicated oscillation circuits in such a way that the frequencies of the first and second replicated clock signals are equal to the first and second target frequencies allows the oscillation frequencies of the first and second oscillation circuits to be so adjusted that the first and second clock frequencies are equal to the first and second target frequencies.

In the aspect of the invention, the first adjustment circuit may stop updating first control data that controls the oscillation frequency of the first replicated oscillation circuit in a measurement period in which the time difference is measured, and the second adjustment circuit may stop updating second control data that controls the oscillation frequency of the second replicated oscillation circuit in the measurement period.

According to the aspect of the invention with this configuration, since the first and second control data, which control the oscillation frequencies of the first and second oscillation circuits, are not updated in the measurement period, no variation in the first and second clock frequencies occurs in the measurement period. As a result, no variation in the time measurement resolution occurs in the measurement period, whereby the performance of the time-to-digital converter can be increased.

In the aspect of the invention, the time-to-digital converter may further include a reference clock counter that counts the number of clocks of the reference clock signal and outputs an enable signal that becomes active in a count enable period that is a period for which a given number of clocks is counted. The first adjustment circuit may include a first measurement circuit that counts the number of clocks of the first replicated clock signal in the count enable period based on the enable signal and outputs a first clock count, and the second adjustment circuit may include a second measurement circuit that counts the number of clocks of the second replicated clock signal in the count enable period based on the enable signal and outputs a second clock count.

According to the aspect of the invention with this configuration, counting the numbers of clocks of the first and second replicated clock signals in the count enable period defined based on the reference clock signal allows measurement of the frequencies of the first and second replicated clock signals with respect to the frequency of the reference clock signal. Since the first and second replicated clock signals are replicated clock signals of the first and second clock signals, the counts of the number of clocks of the first and second replicated clock signals can be used as results of the measurement of the first and second clock frequencies.

In the aspect of the invention, the first adjustment circuit may include a first comparison circuit that determines a value of a difference between the first clock count and a first target count corresponding to the first target frequency and outputs a first difference value and a first control circuit that includes a first integrator that integrates the first difference value and outputs a first integrated value, and the first control circuit outputting first control data that controls the oscillation frequencies of the first oscillation circuit and the first replicated oscillation circuit based on the first integrated value, and the second adjustment circuit may include a second comparison circuit that determines a value of a difference between the second clock count and a second target count corresponding to the second target frequency and outputs a second difference value and a second control circuit that includes a second integrator that integrates the second difference value and outputs a second integrated value, and the second control circuit outputting second control data that controls the oscillation frequencies of the second oscillation circuit and the second replicated oscillation circuit based on the second integrated value.

According to the aspect of the invention with this configuration, the first and second comparison circuits output the first and second difference values, which are the values of the differences between the first and second clock counts and the first and second targets counts, and the first and second control circuits integrate the first and second difference values to generate the first and second control data, whereby feedback control can be so performed on the oscillation frequencies of the first and second replicated oscillation circuits that the first and second replicated clock signal frequencies are equal to the first and second target frequencies.

In the aspect of the invention, the processing circuit may include a phase comparison circuit that compares the first clock signal with the second clock signal in terms of phase, a first counter that counts the number of clocks of the first clock signal and outputs a first count, a second counter that counts the number of clocks of the second clock signal and outputs a second count, and a calculation circuit that determines the digital value based on the first and second counts.

According to the aspect of the invention with this configuration, the comparison between the phase of the first clock signal and the phase of the second clock signal allows detection of whether the order of the edges of the first clock signal and the edges of the second clock signal is reversed. The time difference between the transition timing of the first signal and the transition timing of the second signal can then be determined based on the number of clocks of the first clock signal and the number of clocks of the second clock signal counted until the change occurs.

In the aspect of the invention, the calculation circuit may determine a resolution of time measurement based on the first clock frequency measured by the first adjustment circuit and the second clock frequency measured by the second adjustment circuit and use the resolution to determine the digital value.

According to the aspect of the invention with this configuration, since the first and second clock frequencies are measured to control the first and second clock frequencies, the results of the measurement can be used to find actual first and second clock frequencies in the time measurement. The resolution is then determined from the measured first and second clock frequencies, whereby accurate time measurement based on the actual first and second clock frequencies can be performed.

Another aspect of the invention relates to a circuit device including any of the time-to-digital converters described above.

Still another aspect of the invention relates to a circuit device including any of the time-to-digital converters described above and an interface circuit that receives a mode setting signal that sets a mode in which time measurement is performed, and the time-to-digital converter transitions from the first mode to the second mode based on the mode setting signal.

The mode setting signal inputted from an apparatus external to the circuit device therefore allows the time measurement to start. In the period for which no time measurement is performed, the oscillation frequencies of the first and second oscillation circuits are so adjusted that the accuracy of the first and second clock frequencies can be increased.

Still another aspect of the invention relates to a physical quantity measurement apparatus including any of the time-to-digital converters described above.

Still another aspect of the invention relates to an electronic instrument including any of the time-to-digital converters described above.

Still another aspect of the invention relates to a vehicle including any of the time-to-digital converters described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferable embodiment of the invention will be described below in detail. It is not intended that the present embodiment described below unduly limits the contents of the invention set forth in the appended claims, and all configurations described in the present embodiment are not necessarily essential as solutions provided by the invention.

1. Time-to-Digital Converter

Figure 1:
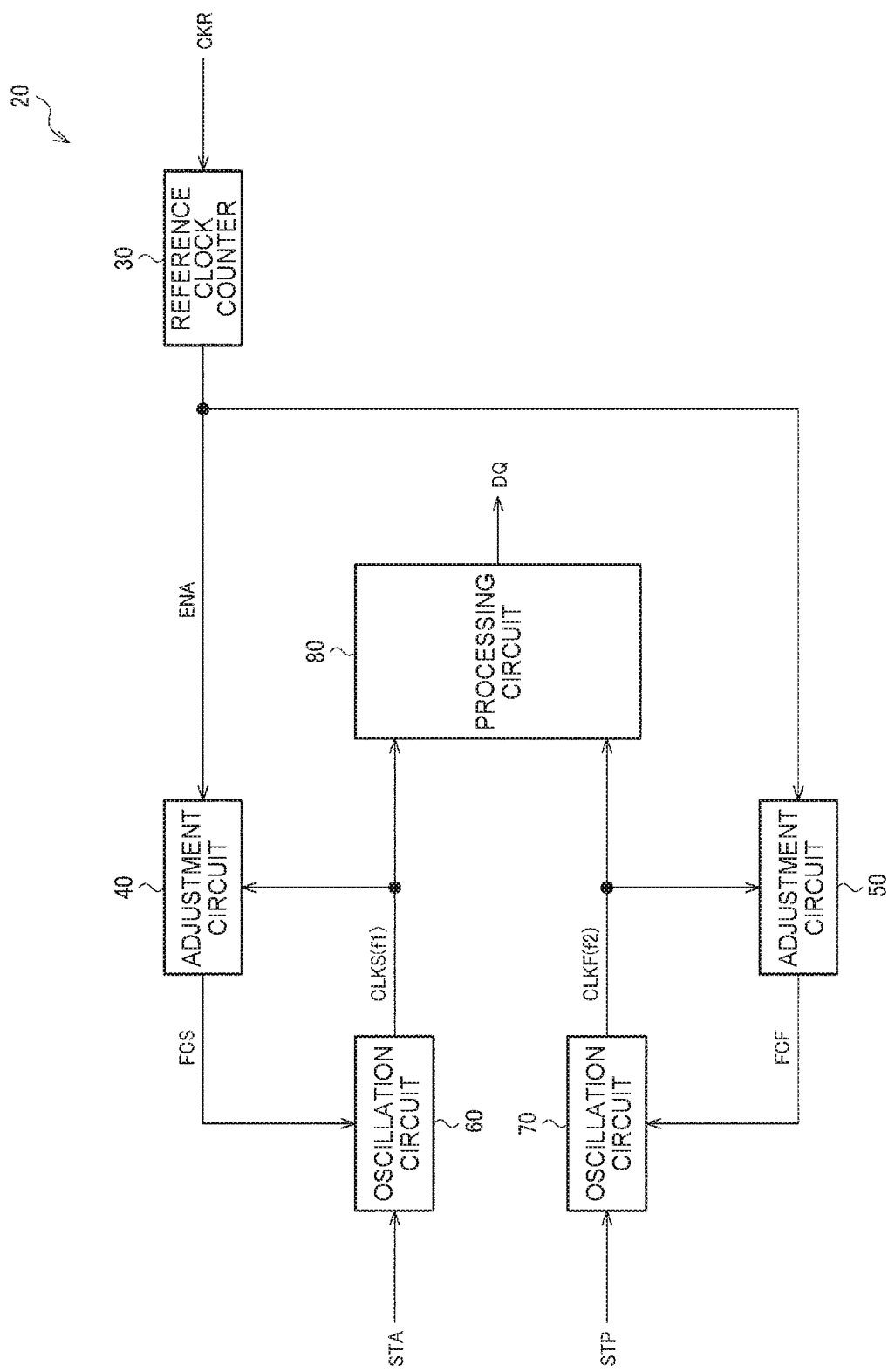
FIG. 1 shows an example of the configuration of a time-to-digital converter according to an embodiment of the invention.

FIG. 1 shows an example of the configuration of a time-to-digital converter according to the present embodiment. A time-to-digital converter 20 can include an oscillation circuit 60 (first oscillation circuit), an oscillation circuit 70 (second oscillation circuit), an adjustment circuit 40 (first adjustment circuit), an adjustment circuit 50 (second adjustment circuit), and a processing circuit 80. The time-to-digital converter 20 can further include a reference clock counter 30 (counter). The time-to-digital converter to which the embodiment of the invention is applied does not necessarily have the configuration shown in FIG. 1, and a variety of variations are conceivable, for example, part of the components of the configuration shown in FIG. 1 (reference clock counter 30, for example) may be omitted, or another component may be added to the configuration shown in FIG. 1.

The oscillation circuit 60 starts oscillating at the transition timing of a signal STA (first signal, for example, start signal) to generate a clock signal CLKS (first clock signal) having a clock frequency f1 (first clock frequency). The oscillation circuit 70 starts oscillating at the transition timing of a signal STP (second signal, for example, stop signal) to generate a clock signal CLKF (second clock signal) having a clock frequency f2 (second clock frequency) different from the first clock frequency f1.

The clock signal CLKS is the oscillation signal from the oscillation circuit 60 or a clock signal produced by dividing the oscillation signal. The clock frequency f1 is therefore the oscillation frequency of the oscillation circuit 60 or the frequency of the clock signal produced by the division. Similarly, the clock signal CLKF is the oscillation signal from the oscillation circuit 70 or a clock signal produced by dividing the oscillation signal. The clock frequency f2 is therefore the oscillation frequency of the oscillation circuit 70 or the frequency of the clock signal produced by the division. For example, the clock frequency f2 is higher than the clock frequency f1.

The oscillation circuit 60 is a ring oscillator that oscillates in response, for example, to the signal STA, which serves as a trigger. That is, the oscillation loop (feedback loop) of the ring oscillator is enabled at the rising edge (or falling edge) of the signal STA, and the ring oscillator starts oscillating. Similarly, the oscillation circuit 70 is a ring oscillator that oscillates in response, for example, to the signal STP, which serves as a trigger. That is, the oscillation loop of the ring oscillator is enabled at the rising edge (or falling edge) of the signal STP, and the ring oscillator starts oscillating. The oscillation circuit 60 or 70 is not limited to a ring oscillator.

The adjustment circuit 40 measures the clock frequency f1 based on a reference clock signal CKR and adjusts the oscillation frequency of the oscillation circuit 60 in such a way that the clock frequency f1 is equal to a target frequency tgf1 (first target frequency). The adjustment circuit 50 measures the clock frequency f2 based on the reference clock signal CKR and adjusts the oscillation frequency of the oscillation circuit 70 in such a way that the clock frequency f2 is equal to a target frequency tgf2 (second target frequency). The reference clock signal CKR is a clock signal that serves as the reference of the oscillation frequency of each of the oscillation circuits 60 and 70.

To measure the clock frequencies f1 and f2, the clock frequencies f1 and f2 themselves may be measured, or parameters corresponding to the clock frequencies f1 and f2 may be measured. Still instead, the cycles that are reciprocals of the clock frequencies f1 and f2 may be measured, or parameters corresponding to the cycles may be measured. For example, in FIG. 1, the reference clock counter 30 counts the number of clocks of the reference clock signal CKR and outputs an enable signal ENA, which is active during the period for which a given number of clocks is counted (given period). The adjustment circuits 40 and 50 count the number of clocks of the clock signals CLKS and CLKF for the period during which the enable signal ENA is active to measure the clock frequencies f1 and f2. In this case, the number of clocks (counts) of the clock signals CLKS and CLKF in the given period are the parameters corresponding to the clock frequencies f1 and f2.

The configuration for measuring the clock frequencies f1 and f2 based on the reference clock signal CKR is not limited to the configuration shown in FIG. 1. For example, the reference clock signal CKR may be inputted to the adjustment circuits 40 and 50. In this case, for example, the adjustment circuits 40 and 50 may each be provided with a counter corresponding to the reference clock counter 30. In FIG. 1, the adjustment circuits 40 and 50 measure the clock frequencies f1 and f2 based on the clock signals CLKS and CLKF from the oscillation circuits 60 and 70, but not necessarily. For example, circuits that replicate the oscillation circuits 60 and 70 may be provided, and the clock frequencies f1 and f2 may be measured based on clock signals from the replicated circuits, as will be described later.

The adjustment circuit 40 generates control data FCS (first control data, first control signal) based on the measured clock frequency f1 and performs feedback control on the oscillation frequency of the oscillation circuit 60 by using the control data FCS in such a way that the clock frequency f1 is equal to the target frequency tgf1. For example, the adjustment circuit 40 performs proportional-integral (PI) control or proportional-integral-differential (PID) control based on the difference (f1−tgf1). The adjustment circuit 50 generates control data FCF (second control data, second control signal) based on the measured clock frequency f2 and performs feedback control on the oscillation frequency of the oscillation circuit 70 by using the control data FCF in such a way that the clock frequency f2 is equal to the target frequency tgf2. For example, the adjustment circuit 50 performs PI (proportional-integral) control or PID (proportional-integral-differential) control based on the difference (f2−tgf2). The target frequencies fgf1 and tgf2 are each set, for example, by setting a register (register circuit 16 in FIG. 13, for example).

The oscillation circuits 60 and 70 oscillate at the oscillation frequency corresponding to signal values (code values) of the control data FCS and FCF. For example, in the case where the oscillation circuits 60 and 70 are each a ring oscillator, the control data FCS and FCF are used to control the loads (capacitance and resistance, for example) of the oscillation loops and drive performance of drive circuits (inverters, for example) for control of the oscillation frequencies.

The processing circuit 80 converts the time difference between the transition timing of the signal STA and the transition timing of the signal STP into a digital value DQ based on the clock signals CLKS and CLKF. Specifically, the first edge of the clock signal CLKS is generated at the transition timing of the signal STA, and the first edge of the clock signal CLKF is generated at the transition timing of the signal STP. The phase difference between the first edges of the clock signals CLKS and CLKF is equal to the time difference between the transition timings of the signals STA and STP. Since the inter-edge time difference between the clock signals CLKS and CLKF is decremented by Δt, the time difference can be determined by counting the number of clocks until the state in which the order of the edges of the clock signal CLKS and the edges of the clock signal CLKF is reversed and multiplying the count by Δt.

Δt represents the resolution of the time measurement and can be expressed by $\Delta t=|1/f1-1/f2|=|f1-f2|/(f1\times f2)$. That is, the time-to-digital converter 20 converts time into a digital value at the resolution corresponding to the frequency difference between the clock frequencies f1 and f2 |f1−f2|. The clock frequencies f1 and f2 are so selected that a desired resolution Δt is achieved. That is, the target frequencies tgf1 and tgf2 are so set as to allow clock frequencies f1 and f2 that achieve a desired resolution Δt. For example, the target frequencies tgf1 and tgf2 are so set that a frequency relationship N/tgf1=M/tgf2 (N and M are integers greater than or equal to 2 and different from each other) is achieved.

According to the embodiment described above, based on the reference clock signal CKR, the clock frequency f1 of the clock signal CLKS is so controlled as to be equal to the target frequency tgf1, and the clock frequency f2 of the clock signal CLKF is so controlled as to be equal to the target frequency tgf2. The control described above can reduce errors of the clock frequencies f1 and f2 resulting from the oscillation characteristics of the oscillation circuits 60 and 70 (for example, process variation in oscillation frequency, temperature characteristic of oscillation frequency, and dependence of oscillation frequency on power source voltage). Since the resolution Δt of the time measurement corresponds to the frequency difference between the clock frequencies f1 and f2 or |f1−f2|, as described above, an increase in accuracy of the clock frequencies f1 and f2 allows an increase in accuracy of the resolution Δt. In the present embodiment, the time difference between the transition timings of the signals STA and STP inputted externally to the time-to-digital converter 20 (produced at arbitrary timings) can be measured at an accurate resolution Δt.

2. First Example of Detailed Configuration

Figure 2:
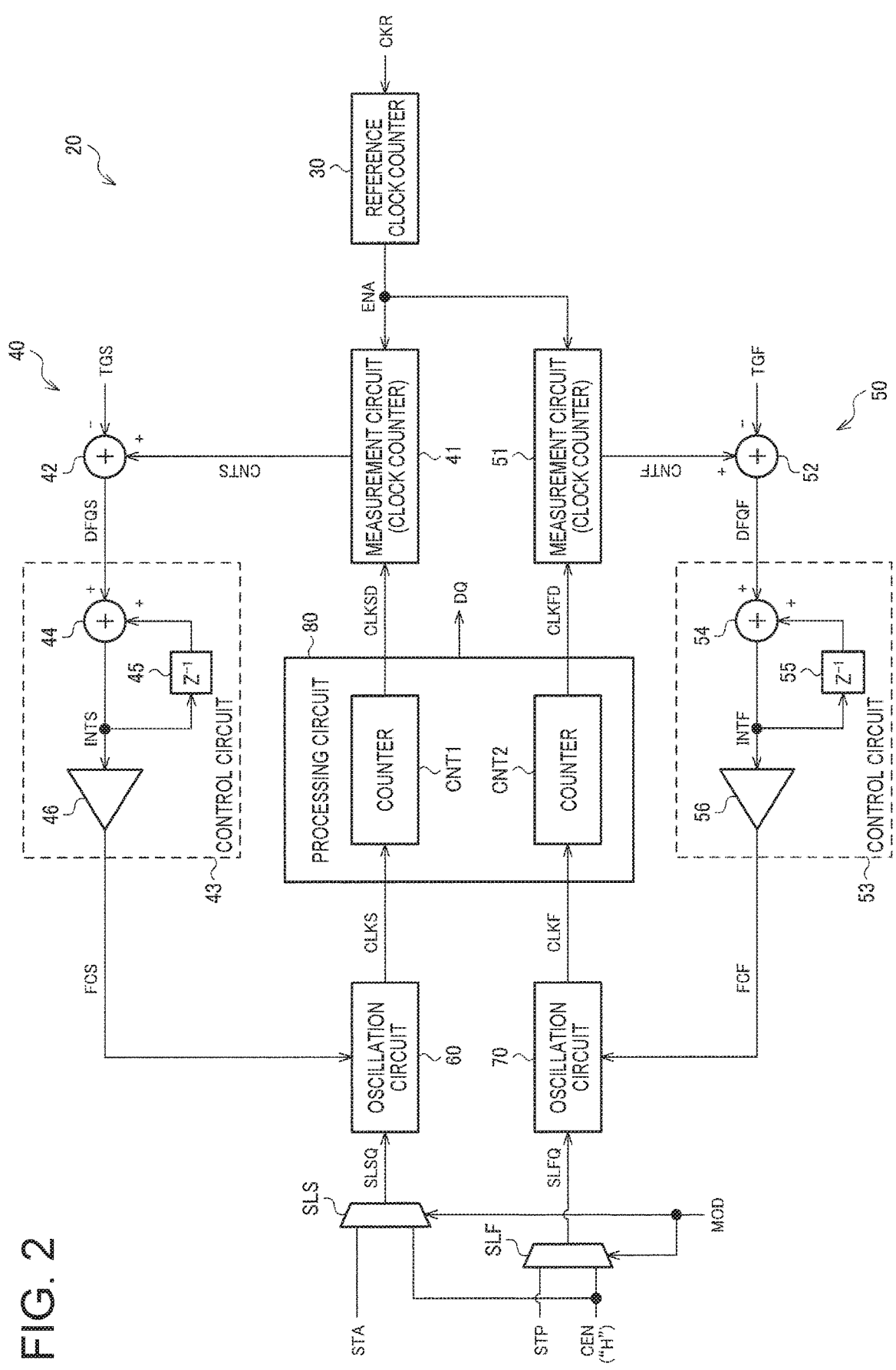
FIG. 2 is a first example of a detailed configuration of the time-to-digital converter.

FIG. 2 is a first example of a detailed configuration of the time-to-digital converter. In FIG. 2, the adjustment circuit 40 includes a measurement circuit 41 (first measurement circuit), a comparison circuit 42 (first comparison circuit), and a control circuit 43 (first control circuit), and the adjustment circuit 50 includes a measurement circuit 51 (second measurement circuit), a comparison circuit 52 (second comparison circuit), and a control circuit 53 (second control circuit), in addition to the components in FIG. 1. Further, the processing circuit 80 includes a counter CNT1 (first counter) and a counter CNT2 (second counter). The same components as those having been already described have the same reference characters, and no description of the same components will be made as appropriate.

The measurement circuit 41 measures the clock frequency f1 based on the reference clock signal CKR. The comparison circuit 42 compares the clock frequency f1 measured by the measurement circuit 41 with the target frequency tgf1. The control circuit 43 outputs the control data FCS, which controls the oscillation frequency of the oscillation circuit 60, based on the result of the comparison performed by the comparison circuit 42. The measurement circuit 51 measures the clock frequency f2 based on the reference clock signal CKR. The comparison circuit compares the clock frequency f2 measured by the measurement circuit 51 with the target frequency tgf2. The control circuit 53 outputs the control data FCF, which controls the oscillation frequency of the oscillation circuit 70, based on the result of the comparison performed by the comparison circuit 52.

To compare the measured clock frequencies f1 and f2 with the target frequencies tgf1 and tgf2, the clock frequencies f1 and f2 themselves may be compared with the target frequencies tgf1 and tgf2 themselves, or parameters corresponding to the clock frequencies f1 and f2 may be compared with parameters corresponding to the target frequencies tgf1 and tgf2. In FIG. 2, clock counts CNTS and CNTF are the parameters corresponding to the clock frequencies f1 and f2, and target counts TGS and TGF are the parameters corresponding to the target frequencies tgf1 and tgf2. The comparison circuits 42 and 52 output the value of the difference between the frequencies (or parameters corresponding to frequencies) or information representing which frequency is higher than the other as the result of the comparison. The difference value is a value containing information representing which frequency is higher than the other and information on the magnitude of the difference. The control circuits 43 and 53 generates the control data FCS and FCF for performing negative feedback control on the oscillation frequencies of the oscillation circuits 60 and 70 based on the information the value of the difference between the frequencies or the information representing which frequency is higher than the other.

According to the present embodiment, measuring the clock frequencies f1 and f2, comparing the measured clock frequencies f1 and f2 with the target frequencies tgf1 and tgf2, and outputting the control data FCS and FCF based on the results of the comparison allow the oscillation frequencies of the oscillation circuits 60 and 70 to be so adjusted that the clock frequencies f1 and f2 are equal to the target frequencies tgf1 and tgf2.

Figure 3:
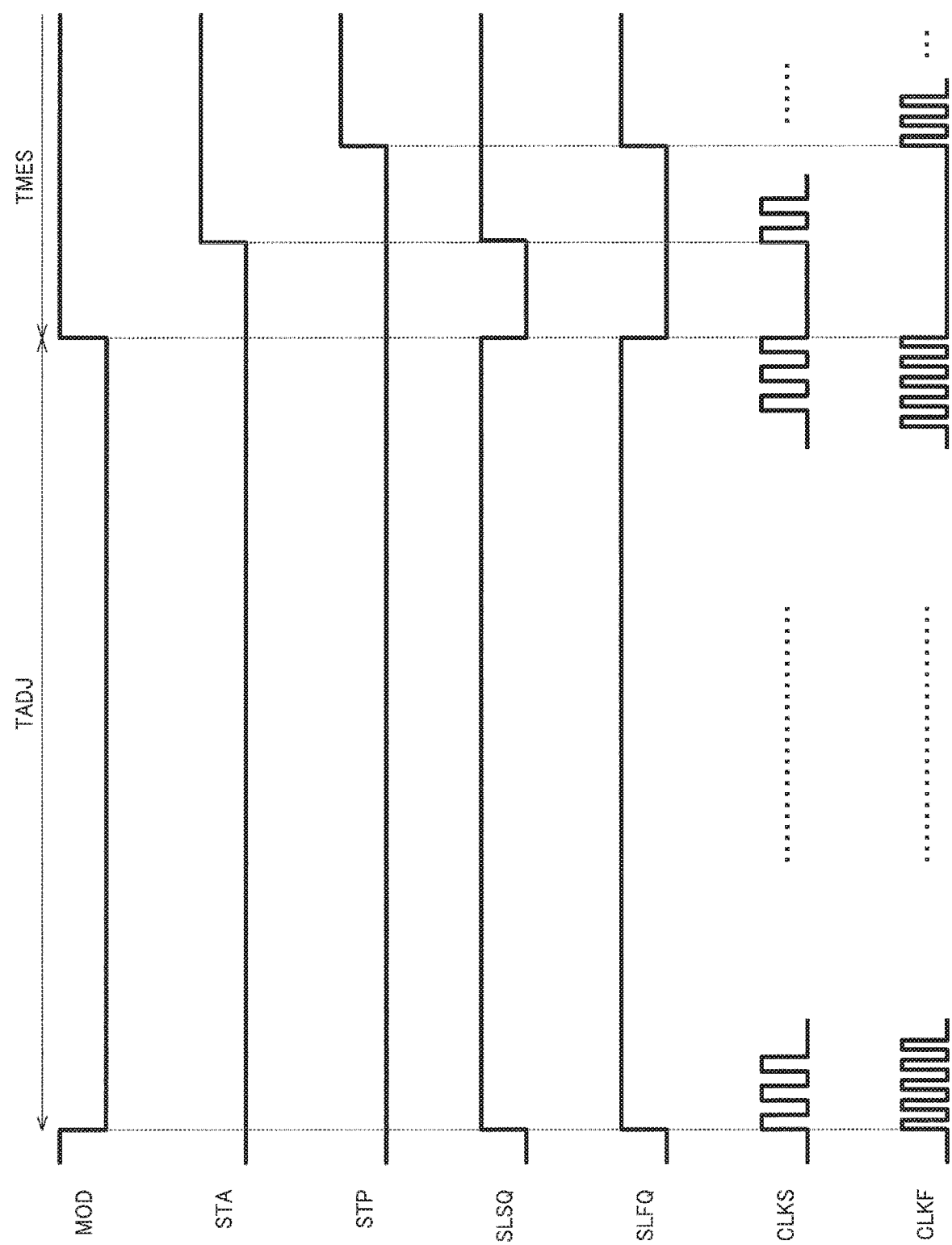
FIG. 3 is a timing chart for describing sequence control.

Further, in the present embodiment, a first mode (first period) in which the oscillation frequencies are adjusted and a second mode (second period) in which the time measurement is performed are switched from one to the other with the aid of sequence control. FIG. 3 is a timing chart for describing the sequence control. The description will be made below with reference to FIG. 3 as appropriate.

In FIG. 2, the time-to-digital converter 20 further includes a selector SLS (first selector), which selects the signal STA or an adjustment enable signal CEN, and a selector SLF (second selector), which selects the signal STP or the adjustment enable signal CEN, in addition to the components shown in FIG. 1. Specifically, the selectors SLS and SLF each select a signal based on a mode setting signal MOD. The adjustment enable signal CEN is a signal having a value fixed, for example, to the high level (active).

In the first mode (adjustment period TADJ), the selector SLS selects the adjustment enable signal CEN and outputs the adjustment enable signal CEN to the oscillation circuit 60, and the adjustment circuit 40 adjusts the oscillation frequency of the oscillation circuit 60 having started oscillating in response to the adjustment enable signal CEN. The selector SLF selects the adjustment enable signal CEN and outputs the adjustment enable signal CEN to the oscillation circuit 70, and the adjustment circuit 50 adjusts the oscillation frequency of the oscillation circuit 70 having started oscillating in response to the adjustment enable signal CEN.

Specifically, the mode setting signal MOD has the low level (first logic level) in the first mode, so that the selector SLS outputs the adjustment enable signal CEN having the high level as a signal SLSQ and the selector SLF outputs the adjustment enable signal CEN having the high level as a signal SLFQ, as shown in FIG. 3. The oscillation circuit 60 oscillates in response to the signal SLSQ, which serves as an oscillation enable signal. That is, the oscillation circuit 60 oscillates during the period for which the signal SLSQ has the high level. Similarly, the oscillation circuit 70 oscillates in response to the signal SLFQ, which serves as the oscillation enable signal. That is, the oscillation circuit 70 oscillates during the period for which the signal SLFQ has the high level. In FIG. 3, the oscillation circuits 60 and 70 keep oscillating in the adjustment period TADJ set in the first mode and output the clock signals CLKS and CLKF. The adjustment circuits 40 and 50 adjust the oscillation frequencies of the oscillation circuits 60 and 70 in the adjustment period TADJ.

In the second mode (measurement period TMES), the selector SLS selects the signal STA and outputs the signal STA to the oscillation circuit 60, and the oscillation circuit 60 to which the signal STA has been inputted starts oscillating at the transition timing of the signal STA to generate the clock signal CLKS. The selector SLF selects the signal STP and outputs the signal STP to the oscillation circuit 70, and the oscillation circuit 70 to which the signal STP has been inputted starts oscillating at the transition timing of the signal STP to generate the clock signal CLKF. The processing circuit 80 then converts the time difference between the transition timing of the signal STA and the transition timing of the signal STP into the digital value DQ based on the clock signals CLKS and CLKF.

Specifically, the mode setting signal MOD has the high level (second logic level) in the second mode, so that the selector SLS outputs the signal STA as the signal SLSQ, and the selector SLF outputs the signal STP as the signal SLFQ. When the signal SLSQ (STA) changes from the low level to the high level, the oscillation circuits 60 and 70 start oscillating. Therefore, the generation of the clock signal CLKS starts at the transition timing of the signal STA, and the generation of the clock signal CLKF starts at the transition timing of the signal STP. The signals STA and STP are each, for example, a signal that changes from the low level to the high level at an edge (rising edge or falling edge) of a pulse signal and is maintained at the high level until the time measurement ends. The adjustment circuits 40 and 50 keep outputting the control data FCS and FCF produced when the first mode is switched to the second mode (determined at last moment in first mode) in the second mode.

According to the present embodiment, when the selectors SLS and SLF select the adjustment enable signal CEN in the first mode, the oscillation circuits 60 and 70 keep generating the clock signals CLKS and CLKF. On the other hand, when the selectors SLS and SLF select the signals STA and STP in the second mode, the oscillation circuits 60 and 70 can start oscillating at the transition timings of the signal STA and STP. Switching the oscillation frequency adjustment and the time measurement from one to the other with the aid of the sequence control as described above allows accurate time measurement in the second mode by using the clock frequencies f1 and f2 accurately adjusted in the first mode.

Figure 4:
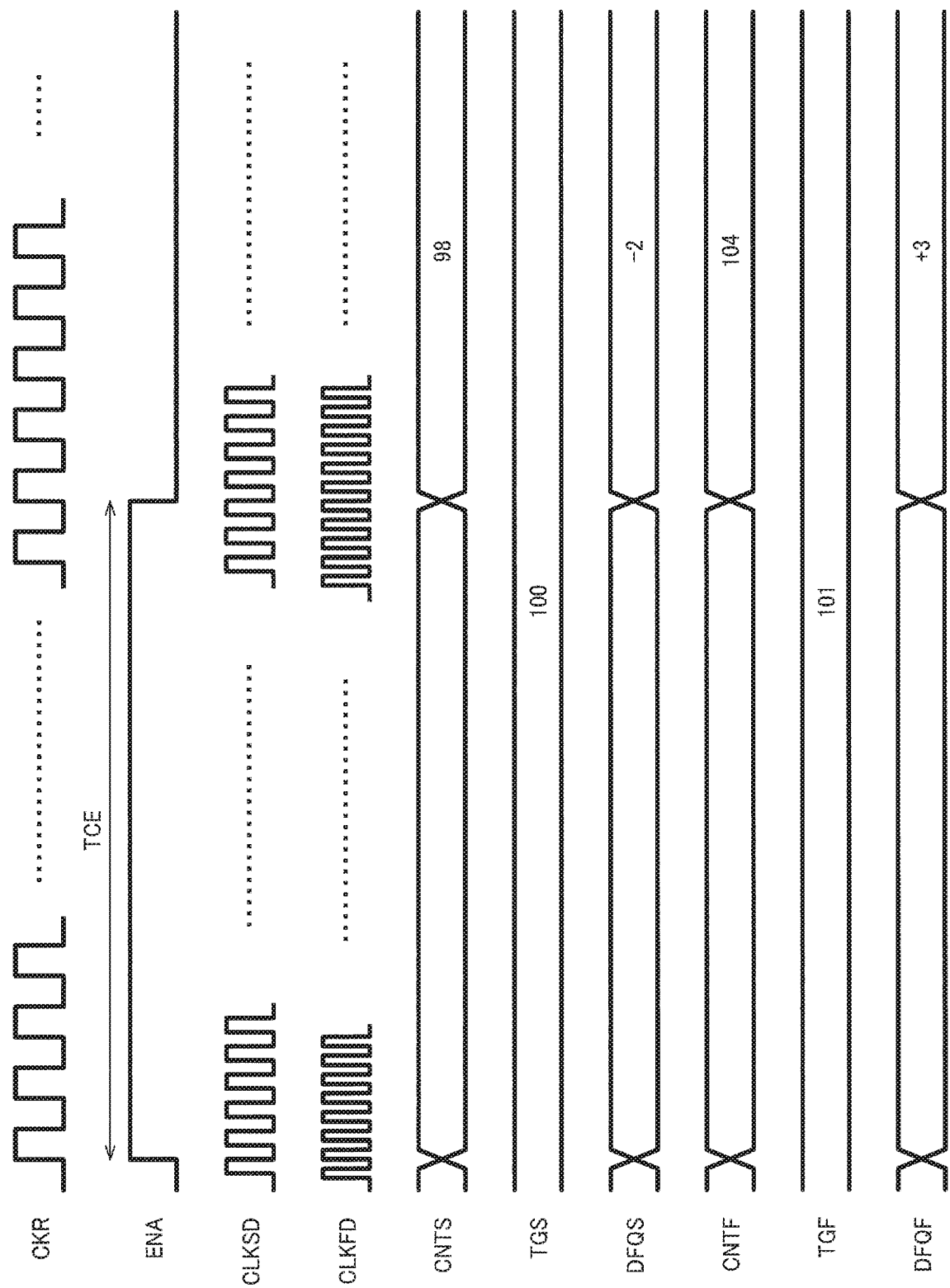
FIG. 4 is a timing chart for describing the action of the time-to-digital converter in a first mode.

FIG. 4 is a timing chart for describing the action of the time-to-digital converter in the first mode (adjustment period TADJ). The description will be made below with reference to FIG. 4 as appropriate.

The reference clock counter 30 counts the number of clocks of the reference clock signal CKR and outputs the enable signal ENA, which is active in a count enable period TCE, which is a period for which a given number of clocks is counted, as shown in FIG. 4. The measurement circuit 41 (first clock counter) counts the number of clocks of the clock signal CLKS in the count enable period TCE based on the enable signal ENA and outputs the clock count CNTS (first clock count). The measurement circuit 51 (second clock counter) counts the number of clocks of the clock signal CLKF in the count enable period TCE based on the enable signal ENA and outputs the clock count CNTF (second clock count).

Specifically, the counter CNT1 in the processing circuit 80 divides the clock signal CLKS into a clock signal CLKSD and outputs the clock signal CLKSD, and the measurement circuit 41 counts the number of clocks of the clock signal CLKSD produced by the division. That is, the clock count CNTS is the number of clocks of the clock signal CLKS in the count enable period TCE multiplied by the division ratio. Similarly, the counter CNT2 in the processing circuit 80 divides the clock signal CLKF into a clock signal CLKFD and outputs the clock signal CLKFD, and the measurement circuit 51 counts the number of clocks of the clock signal CLKFD produced by the division. That is, the clock count CNTF is the number of clocks of the clock signal CLKF in the count enable period TCE multiplied by the division ratio. The counters CNT1 and CNT2 are each a counter used in the time measurement in the second mode (measurement period TMES). In the first mode, the counters CNT1 and CNT2 are each used as a divider. The configuration for counting the number of clocks of the clock signals CLKS and CLKF is not limited to the configuration described above. For example, the clock signals CLKS and CLKF may be inputted to the measurement circuits 41 and 51, and the measurement circuits 41 and 51 may output the number of clocks of the clock signals CLKS and CLKF in the count enable period TCE as the clock counts CNTS and CNTF.

According to the present embodiment, counting the number of clocks of the clock signals CLKS and CLKF in the count enable period TCE defined based on the reference clock signal CKR allows measurement of the clock frequencies f1 and f2 with respect to the frequency of the reference clock signal CKR. That is, since the numbers of clocks of the clock signals CLKS and CLKF in the count enable period TCE depends on the clock frequencies f1 and f2, the numbers of clocks can be used as results of the measurement of the clock frequencies f1 and f2.

Further, in the present embodiment, the comparison circuit 42 (first difference calculator) determines the value of the difference between the clock count CNTS and the target count TGS (first target count) corresponding to the target frequency tgf1 and outputs a difference value DFQS (first difference value). The control circuit 43 includes a first integrator that integrates the difference value DFQS and outputs an integrated value INTS (first integrated value). The control circuit 43 outputs the control data FCS, which controls the oscillation frequency of the oscillation circuit 60, based on the integrated value INTS. Similarly, the comparison circuit 52 (second difference calculator) determines the value of the difference between the clock count CNTF and the target count TGF (second target count) corresponding to the target frequency tgf2 and outputs a difference value DFQF (second difference value). The control circuit 53 includes a second integrator that integrates the difference value DFQF and outputs an integrated value INTF (second integrated value). The control circuit 53 outputs the control data FCF, which controls the oscillation frequency of the oscillation circuit 70, based on the integrated value INTF. The target counts TGS and TGF are each set, for example, by setting a register (register circuit 16 in FIG. 13, for example) external to a circuit device including the time-to-digital converter 20.

Specifically, the control circuit 43 includes an adder 44, a delay circuit 45, and a gain multiplication circuit 46. The delay circuit 45 delays the integrated value INTS by one action clock (one discrete period), and the adder 44 adds the delayed integrated value INTS to the difference value DFQS and outputs the resultant integrated value INTS. The first integrator is formed of the adder 44 and the delay circuit 45. The gain multiplication circuit 46 multiplies the integrated value INTS by a given gain and outputs the control data FCS. Similarly, the control circuit 53 includes an adder 54, a delay circuit 55, and a gain multiplication circuit 56. The delay circuit 55 delays the integrated value INTF by one action clock (one discrete period), and the adder 54 adds the delayed integrated value INTF to the difference value DFQF and outputs the resultant integrated value INTF. The second integrator is formed of the adder 54 and the delay circuit 55. The gain multiplication circuit 56 multiplies the integrated value INTF by a given gain and outputs the control data FCF. The gain multiplication circuits 46 and 56 may be omitted, and the integrated values INTS and INTF may be outputted as the control data FCS and FCF.

For example, assume that the clock count CNTS, which is the counted number of clocks of the clock signal CLKS in the count enable period TCE, is "98", and that the target count TGS is "100", as shown in FIG. 4. In this case, the difference value DFQS is "−2". Further, assume that the clock count CNTF, which is the counted number of clocks of the clock signal CLKF in the count enable period TCE, is, for example, "104", and that the target count TGF is, for example, "101". In this case, the difference value DFQF is "+3". Repeating the measurement described above allows time-series difference values DFQS and DFQF, and the first and second integrators integrate the time-series difference values DFQS and DFQF to generate time-series control data FCS and FCF. Controlling the oscillation frequencies of the oscillation circuits 60 and 70 by using the time-series control data FCS and FCF allows the clock frequencies f1 and f2 of the clock signals CLKS and CLKF to approach the target frequencies tgf1 and tgf2.

According to the present embodiment, the comparison circuits 42 and 52 output the values of the differences DFQS and DFQF between the clock counts CNTS, CNTF and the targets counts TGS, TGF, and the control circuits 43 and 53 integrate the difference values DFQS and DFQF to generate the control data FCS and FCF, whereby the feedback control can be so performed that the clock frequencies f1 and f2 are equal to the target frequencies tgf1 an tgf2.

Further, in the present embodiment, a circuit device 10 can include the time-to-digital converter 20 and an interface circuit 14, as will be described later with reference to FIG. 13. The interface circuit 14 receives the mode setting signal MOD, which sets the time measurement mode, from an apparatus external to the circuit device 10 (processing device, for example). The time-to-digital converter 20 then transitions from the first mode to the second mode based on the mode setting signal MOD. For example, the mode setting signal MOD is received as a register write signal. Instead, the mode setting signal MOD is received as a mode specifying command signal. Still instead, the mode setting signal MOD may be a terminal setting signal that is inputted through a terminal of the circuit device 10 and specifies a mode based on the logic level of the terminal setting signal.

According to the present embodiment, the mode setting signal MOD inputted from an apparatus external to the circuit device 10 including the time-to-digital converter 20 allows the time measurement to start. For example, a processing device or any other apparatus external to the circuit device 10 can control the sequence of actions performed by the time-to-digital converter 20 with the aid of an application that controls the time measurement period (period in which signals STA and STP are produced) to allow the time-to-digital converter 20 to perform the time measurement. In the period for which no time measurement is performed, the oscillation frequencies of the oscillation circuits 60 and 70 are so adjusted that the accuracy of the clock frequencies f1 and f2 can be increased.

The sequence control method is not limited to the external control described above. For example, the circuit device may include a control circuit, and the control circuit may perform the sequence control for switching the first mode and the second mode from one to the other.

3. Second Example of Detailed Configuration

Figure 5:
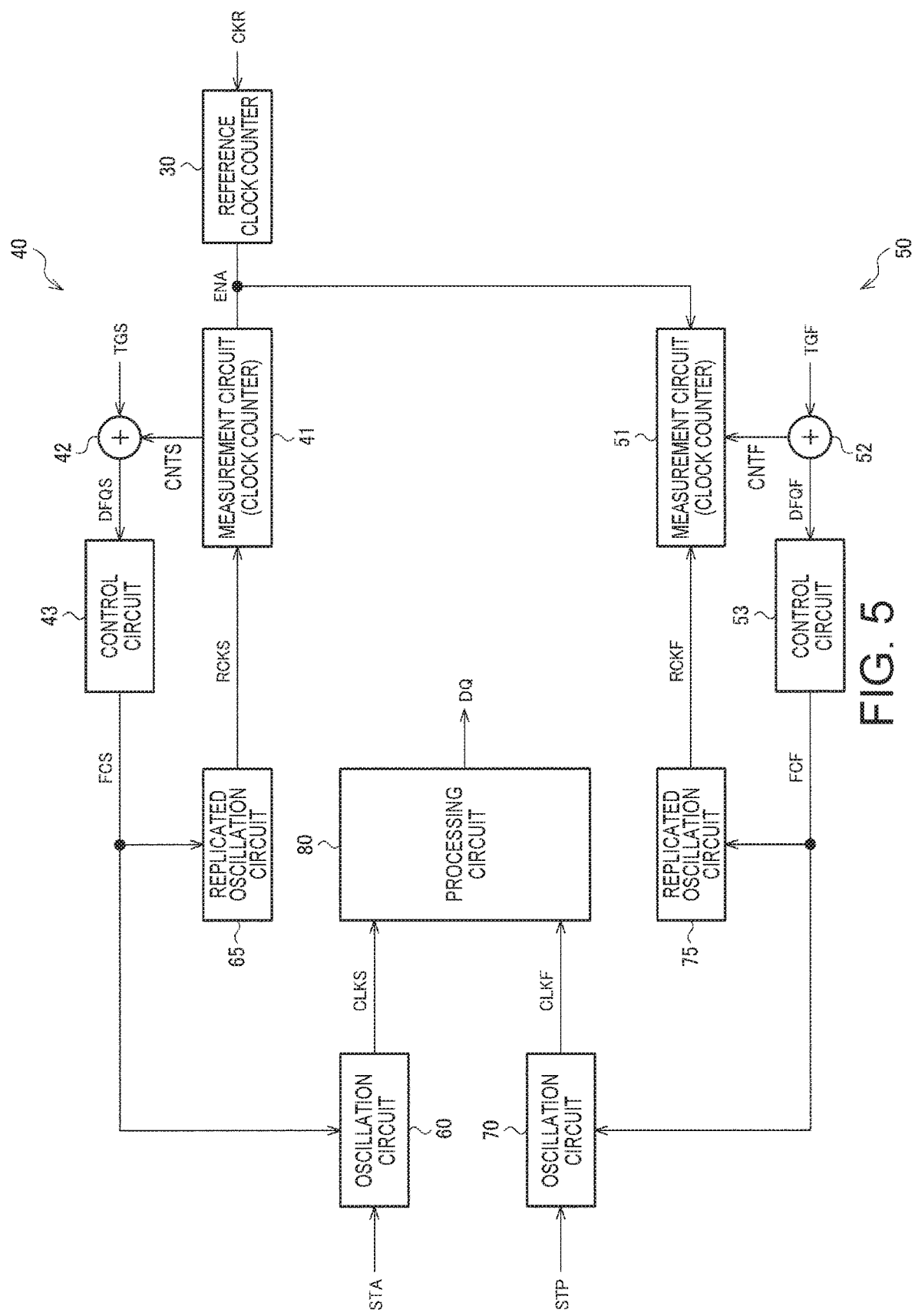
FIG. 5 shows a second example of the detailed configuration of the time-to-digital converter.

FIG. 5 shows a second example of the detailed configuration of the time-to-digital converter. In FIG. 5, the time-to-digital converter 20 includes a replicated oscillation circuit 65 (first replicated oscillation circuit) and a replicated oscillation circuit 75 (second replicated oscillation circuit) in addition to the components shown in FIG. 1. Further, the adjustment circuit includes the measurement circuit 41, the comparison circuit 42, and the control circuit 43, and the adjustment circuit 50 includes the measurement circuit 51, the comparison circuit 52, and the control circuit 53. The same components as those having been already described have the same reference characters, and no description of the same components will be made as appropriate.

The replicated oscillation circuit 65 is a circuit that replicates the oscillation circuit 60 and generates a replicated clock signal RCKS (first replicated clock signal). The replicated oscillation circuit 75 is a circuit that replicates the oscillation circuit 70 and generates a replicated clock signal RCKF (second replicated clock signal).

The replicated circuits are circuits that replicate the oscillation circuits 60 and 70 and basically have the same configurations as those of the oscillation circuits 60 and 70. The replicated oscillation circuit 65 keeps oscillating also during the time measurement (that is, always oscillates), oscillates at the same oscillation frequency as that of the oscillation circuit 60, and outputs the replicated clock signal RCKS, the frequency of which is equal to the clock frequency f1. Similarly, the replicated oscillation circuit 75 keeps oscillating also during the time measurement (that is, always oscillates), oscillates at the same oscillation frequency as that of the oscillation circuit 70, and outputs the replicated clock signal RCKF, the frequency of which is equal to the clock frequency f2.

The adjustment circuit 40 measures the frequency of the replicated clock signal RCKS based on the reference clock signal CKR to measure the clock frequency f1 and adjusts the oscillation frequency of the replicated oscillation circuit 65 in such a way that the frequency of the replicated clock signal RCKS is equal to the target frequency tgf1. The adjustment circuit 50 measures the frequency of the replicated clock signal RCKF based on the reference clock signal CKR to measure the clock frequency f2 and adjusts the oscillation frequency of the replicated oscillation circuit 75 in such a way that the frequency of the replicated clock signal RCKF is equal to the target frequency tgf2.

Since the replicated oscillation circuit 65 is a circuit that replicates the oscillation circuit 60, adjusting the oscillation frequency of the replicated oscillation circuit 65 in such a way that the frequency of the replicated clock signal RCKS is equal to the target frequency tgf1 allows the oscillation frequency of the oscillation circuit 60 to be so adjusted that the clock frequency f1 is equal to the target frequency tgf1. That is, inputting the control data FCS that controls the oscillation frequency of the replicated oscillation circuit 65 to the oscillation circuit 60 allows adjustment of the oscillation frequency of the oscillation circuit 60 to be equal to (roughly equal to) the oscillation frequency of the replicated oscillation circuit 65. Similarly, since the replicated oscillation circuit 75 is a circuit that replicates the oscillation circuit 70, adjusting the oscillation frequency of the replicated oscillation circuit 75 in such a way that the frequency of the replicated clock signal RCKF is equal to the target frequency tgf2 allows the oscillation frequency of the oscillation circuit 70 to be so adjusted that the clock frequency f2 is equal to the target frequency tgf2. That is, inputting the control data FCF that controls the oscillation frequency of the replicated oscillation circuit 75 to the oscillation circuit 70 allows adjustment of the oscillation frequency of the oscillation circuit 70 to be equal to (roughly equal to) the oscillation frequency of the replicated oscillation circuit 75.

In the present embodiment, the adjustment circuit 40 stops updating the control data FCS that controls the oscillation frequency of the replicated oscillation circuit in the time difference measurement period. The adjustment circuit 50 stops updating the control data FCF that controls the oscillation frequency of the replicated oscillation circuit 75 in the measurement period.

The measurement period is a period in which the time difference between the transition timing of the signal STA and the transition timing of the signal STP is measured at least once. For example, the measurement period is a period that starts when a standby state in which the time-to-digital converter 20 waits for the signals STA and STP is achieved and ends when the standby state is terminated. The standby state is the state in which the oscillation circuits 60 and 70 are enabled (END=H in FIG. 8, for example) or the state in which the processing circuit 80 is performing the measurement (QP=H (non-active) in FIGS. 6 and 7, for example).

The adjustment circuits 40 and 50 measure the frequencies of the replicated clock signals RCKS and RCKF in a time-series manner to update the control data FCS and FCF in a time-series manner. In this process, the control circuits 43 and 53 hold (store) the control data FCS and FCF before the measurement period starts and output the held control data FCS and FCF in the measurement period. For example, out of the time-series control data FCS and FCF, the control data FCS and FCF immediately before the measurement period starts are held.

According to the present embodiment, since the control data FCS and FCF, which control the oscillation frequencies of the oscillation circuits 60 and 70, are not updated in the measurement period, no variation in the clock frequencies f1 and f2 occurs in the measurement period. As a result, no variation in the time measurement resolution Δt occurs in the measurement period, whereby the performance of the time-to-digital converter can be increased (variation in resolution Δt can be reduced, for example).

Further, in the present embodiment, the measurement circuit 41 counts the number of clocks of the replicated clock signal RCKS in the count enable period TCE based on the enable signal ENA and outputs the clock count CNTS. The measurement circuit 51 counts the number of clocks of the replicated clock signal RCKF in the count enable period TCE based on the enable signal ENA and outputs the clock count CNTF.

According to the present embodiment, counting the numbers of clocks of the replicated clock signals RCKS and RCKF in the count enable period TCE defined based on the reference clock signal CKR allows measurement of the frequencies of the replicated clock signals RCKS and RCKF with respect to the frequency of the reference clock signal CKR. Since the frequencies of the replicated clock signals RCKS and RCKF are equal to (roughly equal to) the clock frequencies f1 an f2, the number of clocks can be used as results of the measurement of the clock frequencies f1 and f2.

According to the present embodiment, the comparison circuit 42 determines the value of the difference between the clock count CNTS and the target count TGS (first target count) corresponding to the target frequency tgf1 and outputs the difference value DFQS. The control circuit includes the first integrator that integrates the difference value DFQS and outputs the first integrated value. The control circuit 43 outputs the control data FCS, which controls the oscillation frequencies of the oscillation circuit 60 and the replicated oscillation circuit 65, based on the first integrated value. Similarly, the comparison circuit 52 determines the value of the difference between the clock count CNTF and the target count TGF corresponding to the target frequency tgf2 and outputs the difference value DFQF. The control circuit 53 includes the second integrator that integrates the difference value DFQF and outputs the second integrated value. The control circuit outputs the control data FCF, which controls the oscillation frequencies of the oscillation circuit 70 and the replicated oscillation circuit 75, based on the second integrated value. The control circuits 43 and 53 can be configured in the same manner as the control circuits 43 and 53 in FIG. 2 are configured.

According to the present embodiment, the comparison circuits 42 and 52 output the values of the difference DFQS and DFQF between the clock counts CNTS, CNTF and the target counts TGS, TGF, and the control circuits 43 and 53 integrate the difference values DFQS and DFQF to generate the control data FCS and FCF. The feedback control can therefore be so performed that the frequencies of the replicated clock signals RCKS and RCKF and the clock frequencies f1 and f2 are equal to the target frequencies tgf1 an tgf2.

4. Processing Circuit

Figure 6:
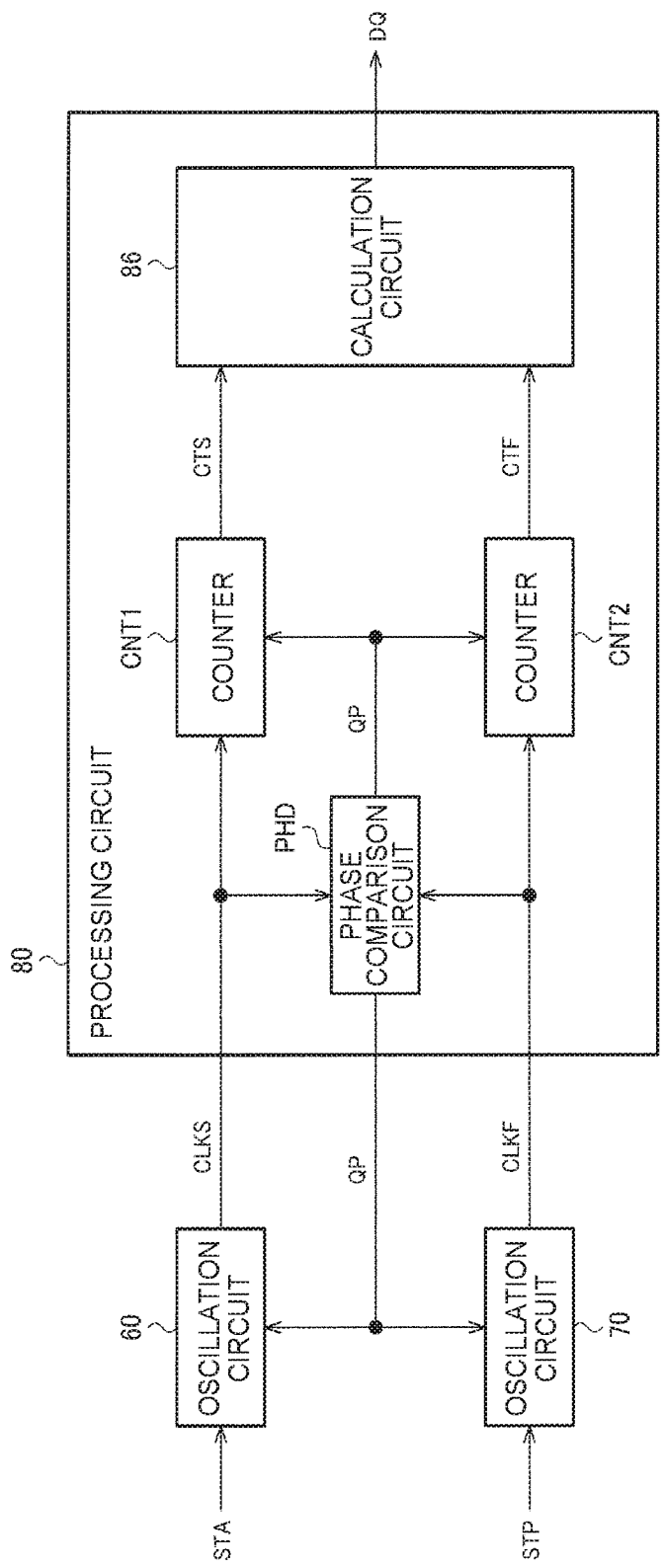
FIG. 6 shows an example of a detailed configuration of a processing circuit.
Figure 7:
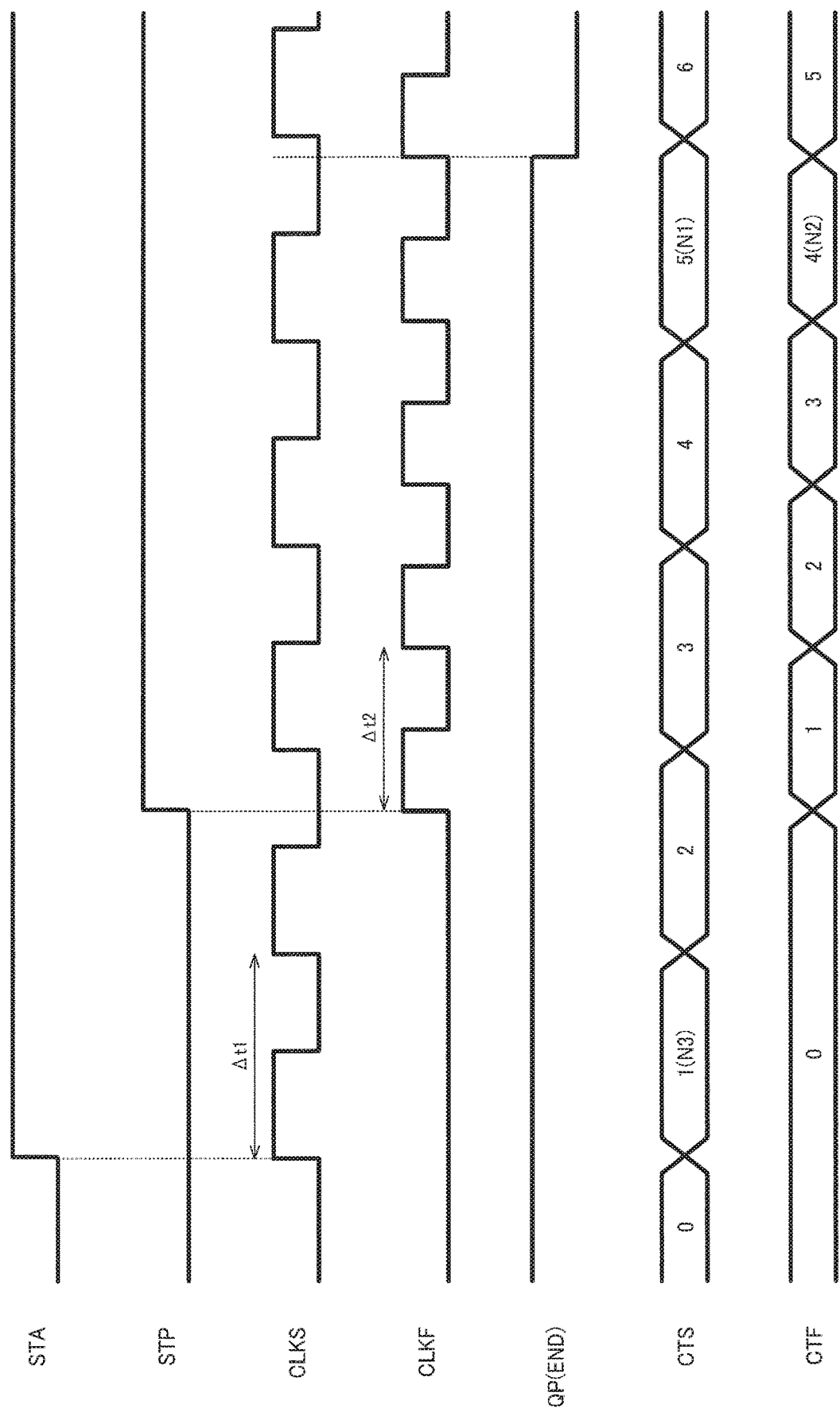
FIG. 7 describes an example of calculation of determining a time difference.

FIG. 6 shows an example of a detailed configuration of the processing circuit. FIG. 7 is a timing chart for describing the action of the processing circuit. The processing circuit 80 includes a phase comparison circuit PHD, the counter CNT1 (first counter), the counter CNT2 (second counter), and a calculation circuit 86, as shown in FIG. 6.

The phase comparison circuit PHD compares the clock signal CLKS and clock signal CLKF in terms of phase. The counter CNT1 counts the number of clocks of the clock signal CLKS and outputs a count CTS (first count), which is the result of the counting. The counter CNT2 counts the number of clocks of the clock signal CLKF and outputs a count CTF (second count), which is the result of the counting. The calculation circuit 86 determines the digital value DQ of the time difference based on the counts CTS and CTF.

Specifically, the phase comparison circuit PHD compares an edge timing of the clock signal CLKS (transition timing, for example, timing of rising edge) with an edge timing of the clock signal CLKF (transition timing, for example, timing of rising edge) and outputs the result of the comparison in the form of a phase comparison result signal QP. For example, when the edge timing of the clock signal CLKS is ahead of the edge timing of the clock signal CLKF, the phase comparison result signal QP has the high level (non-active). When the edge timing of the clock signal CLKF is ahead of the edge timing of the clock signal CLKS, the phase comparison result signal QP has the low level (active). After the level of the phase comparison result signal QP becomes the low level, the oscillation circuits 60 and 70 stop operating, and the counters CNT1 and CNT2 stop counting. The counts CTS and CTF are counts after the counters CNT1 and CNT2 stop counting (when the order of the edges of the clock signal CLKS and the edges of the clock signal CLKF changes is reversed).

An example of the calculation of determining the time difference (digital value DQ) will be described with reference to FIG. 7. The count CTS (=N1) and the count CTF (=N2) at the falling edge (transition timing) of the phase comparison result signal QP from the phase comparison circuit PHD are acquired, as shown in FIG. 7. Let $\Delta t1$ (=1/f1) be the cycle of the clock signal CLKS and $\Delta t2$ (=1/f2) be the cycle of the clock signal CLKF, and the difference between the two cycles is the resolution $\Delta t = |\Delta t1 - \Delta t2|$. The clock frequencies f1 and f2 are set, for example, by setting a register (register circuit 16 in FIG. 13, for example), and the set values are inputted to the calculation circuit 86. Let N3 be N1-N2, and the calculation circuit 86 determines the time difference between the transition timing of the signal STA and the transition timing of the signal STP by $N3 \times \Delta t1 + N2 \times \Delta t$. In the example shown in FIG. 7, since N1=5, N2=4, and N3=1, the time difference is $\Delta t1 + 4 \times \Delta t$. The calculation circuit 86 is formed of a logic circuit.

According to the embodiment described above, the comparison between the phase of the clock signal CLKS and the phase of the clock signal CLKF allows detection of whether the order of the edges of the clock signal CLKS and the clock signal CLKF is reversed. The time difference between the transition timing of the signal STA and the transition timing of the signal STP can then be determined based on the number of clocks of the clock signals CLKS and CLKF counted until the change occurs.

The method for calculating the time difference is not limited to the method described above. For example, the results of the measurement of the clock frequencies f1 and f2 may be used to determine the time difference, as in a variation described below.

In a variation, the calculation circuit 86 determines the resolution of the time measurement based on the clock frequency f1 measured by the adjustment circuit 40 and the clock frequency f2 measured by the adjustment circuit 50, and the resolution is used to determine the digital value DQ of the time difference. Specifically, a time difference TDF is determined by the following Expressions (1) to (3).

$$TDF = N3 \times \Delta t1' + N2 \times \Delta t' \quad (1)$$

$$\Delta t' = (CNTR/fr) \times (1/CNTS - 1/CNTF) \quad (2)$$

$$\Delta t1' = (CNTR/fr) \times (1/CNTS) \quad (3)$$

N3=N1−N2=CTS−CTF, as described above. CNTR is the number of clocks of the reference clock signal CKR in the count enable period TCE (period in which enable signal ENA is active). The frequency fr is the clock frequency of the reference clock signal CKR. The number of clocks CNTR and the clock frequency fr are set, for example, by setting a register (register circuit 16 in FIG. 13, for example), and the set values are inputted to the calculation circuit 86. The clock counts CNTS and CNTF correspond to the results of the measurement of the clock frequencies f1 and f2 and inputted from the measurement circuits 41 and 51 to the calculation circuit 86.

According to the present variation, since the clock frequencies f1 and f2 are measured to control the clock frequencies f1 and f2, the results of the measurement can be used to find actual clock frequencies f1 and f2 in the time measurement. The resolution is then determined from the measured clock frequencies f1 and f2, whereby accurate time measurement based on the actual clock frequencies f1 and f2 can be performed.

5. Oscillation Circuit, Replicated Oscillation Circuit

Figure 8:
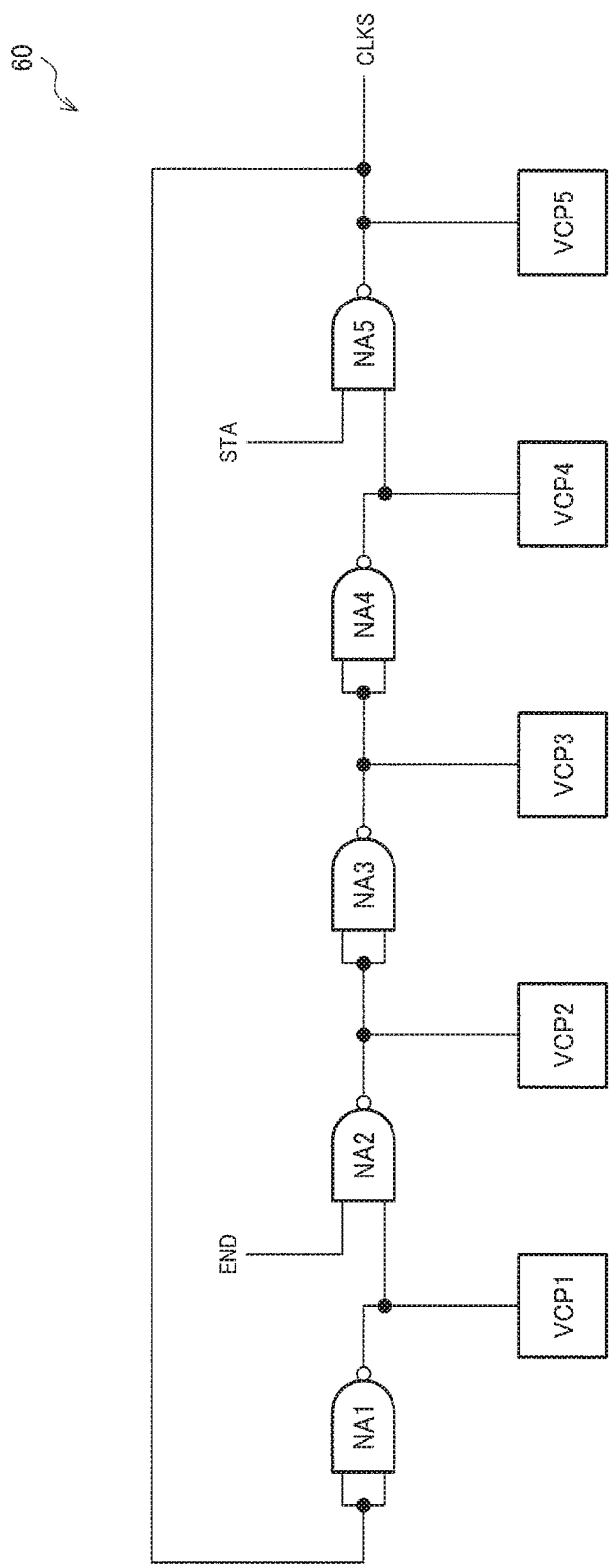
FIG. 8 shows an example of a detailed configuration of an oscillation circuit.

FIG. 8 shows an example of a detailed configuration of the oscillation circuits. In FIG. 8, the description will be made with reference to the oscillation circuit 60, and the oscillation circuit 70 has the same configuration. That is, in the case of the oscillation circuit 70, the signal STA and the clock signal CLKS may be replaced with the signal STP and the clock signal CLKF, respectively, in FIG. 8.

The oscillation circuit 60 is a ring oscillator. The oscillation circuit 60 includes negative logical product circuits NA1 to NA5 and variable capacitance circuits VCP1 to VCP5. The variable capacitance circuit VCP1 is connected to the output node of the negative logical product circuit NA1. Similarly, the variable capacitance circuits VCP2 to VCP5 are connected to the output nodes of the negative logical product circuits NA2 to NA5, respectively. The output signal from the negative logical product circuit NA5 is the clock signal CLKS and is fed back to first and second input nodes of the negative logical product circuit NA1. A signal END is inputted to the first input node of the negative logical product circuit NA2, and the output signal from the negative logical product circuit NA1 is inputted to the second input node of the negative logical product circuit NA2. The signal END will be described later. The output signal from the negative logical product circuit NA2 is inputted to the first and second input nodes of the negative logical product circuit NA3, and the output signal from the negative logical product circuit NA3 is inputted to the first and second input nodes of the negative logical product circuit NA4. The signal STA is inputted to the first input node of the negative logical product circuit NA5, and the output signal from the negative logical product circuit NA4 is inputted to the second input node of the negative logical product circuit NA5. The number of negative logical product circuits contained in the oscillation loop is not limited to five and only needs to be an odd number.

The replicated oscillation circuits 65 and 75 have the same configuration shown in FIG. 8. In place of the signals END and STA in FIG. 8, the high-level signal (signal having level fixed to high level, for example) is inputted to the replicated oscillation circuits 65 and 75.

Figure 9:
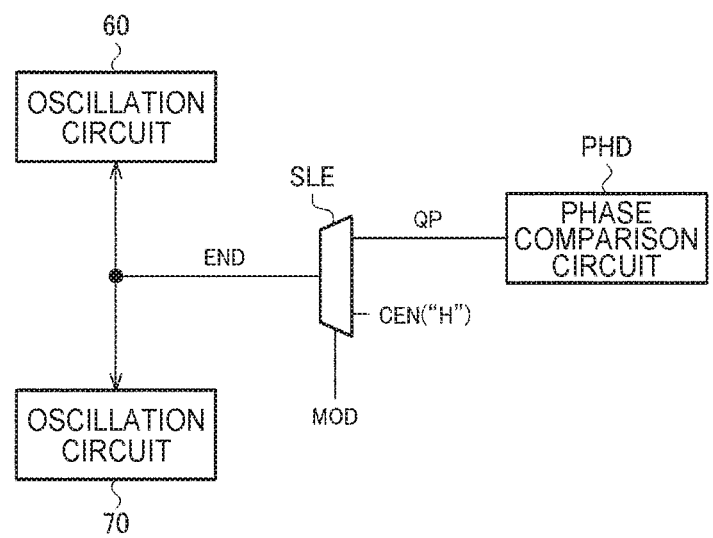
FIG. 9 describes a method for generating a signal END in the case where the sequence control is performed.

FIG. 9 describes a method for generating the signal END in the case where the sequence control shown in FIG. 3 is performed. The time-to-digital converter 20 includes a selector SLE, as shown in FIG. 9. The selector SLE selects the adjustment enable signal CEN (high-level signal) in the first mode and selects the phase comparison result signal QP in the second mode based on the mode setting signal MOD and outputs the selected signal as the signal END to the oscillation circuits 60 and 70. Therefore, the oscillation circuits 60 and 70 keep oscillating in the first mode, and the oscillation circuits 60 and 70 stop oscillating in the second mode when the phase comparison result signal QP changes to the low level.

In the case where the replicated oscillation circuits shown in FIG. 5 are used, the phase comparison result signal QP is inputted as the signal END to the oscillation circuits 60 and 70.

Figure 10:
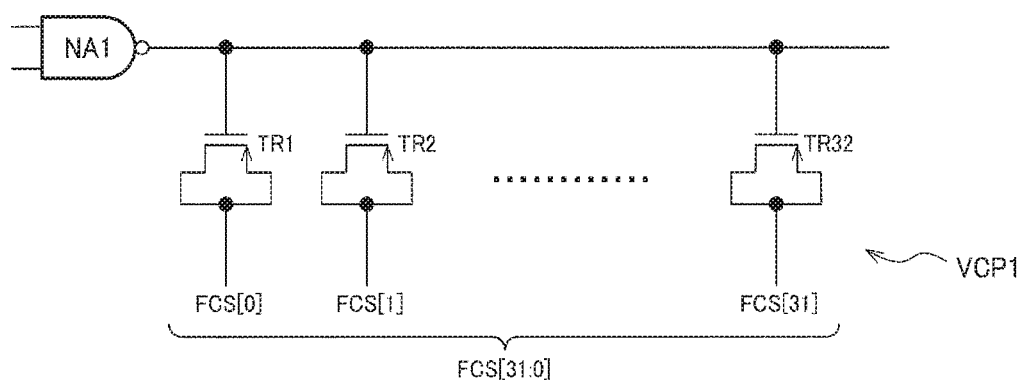
FIG. 10 shows a first example of the configuration of a variable capacitance circuit.

FIG. 10 shows a first example of the configuration of the variable capacitance circuits. In FIG. 10, the description will be made with reference to the variable capacitance circuit VCP1, and the variable capacitance circuits VCP2 to VCP5 have the same configuration. That is, in the case of the variable capacitance circuits VCP2 to VCP5, the negative logical product circuit NA1 may be replaced with the negative logical product circuits NA2 to NA5, respectively, in FIG. 10.

The variable capacitance circuit VCP1 includes transistors TR1 to TR32 (P-type MOS transistors, for example). The gates of the transistors TR1 to TR32 are connected to the output node of the negative logical product circuit NA1. A bit signal FCS[0] is inputted to the source and drain of the transistor TR1. Similarly, bit signals FCS[1] to FCS[31] are inputted to the sources and drains of the transistors TR2 to TR32. The bit signals FCS[0] to FCS[31] are signals carrying the bits of control data FCS[31:0]. The control data FCS[31:0] corresponds to the control data FCS shown in FIG. 1 and other figures.

In each of the transistors TR1 to TR32, the capacitance between the gate and the source (between gate and drain) in a case where the bit signal inputted to the source and drain has the low level differs from the capacitance in a case where the bit signal has the high level. When the load on the negative logical product circuit NA1 (capacitance at output node) changes, the oscillation frequency of the ring oscillator changes, whereby the oscillation frequency of the oscillation circuit 60 can be controlled based on the control data FCS[31:0]. For example, the transistors TR1 to TR32 have the same size. In this case, the control data FCS[31:0] is what is called a thermometer code, and the oscillation frequency is controlled by the number of high-level bit signals out of the bit signals FCS[1] to FCS[31].

Figure 11:
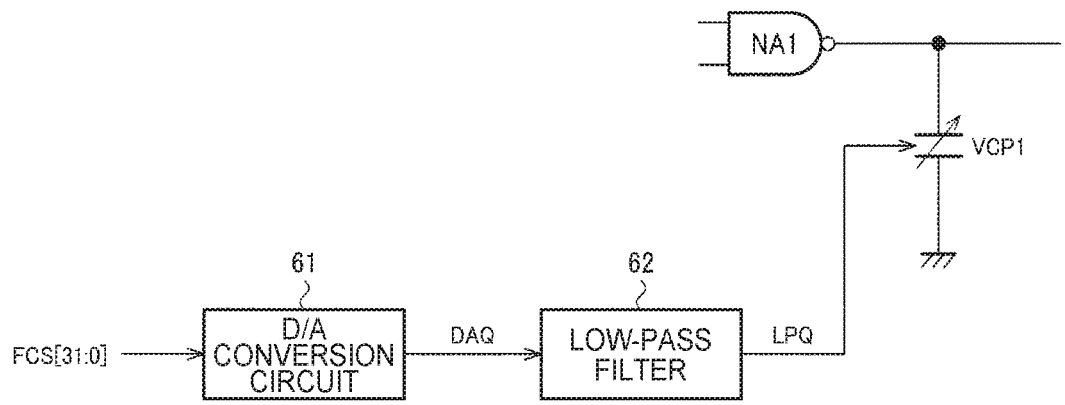
FIG. 11 shows a second example of the configuration of the variable capacitance circuit.

FIG. 11 shows a second example of the configuration of the variable capacitance circuits. In FIG. 11, the description will be made with reference to the variable capacitance circuit VCP1, and the variable capacitance circuits VCP2 to VCP5 have the same configuration.

The variable capacitance circuit VCP1 is a variable capacitance element (variable capacitance diode, for example) having voltage controlled capacitance. The oscillation circuit 60 includes a D/A conversion circuit 61, which converts the control data FCS[31:0] from the digital form into an analog form and outputs a control voltage DAQ, and a low-pass filter 62, which performs low-pass filtering on the voltage DAQ and outputs a control voltage LPQ. The capacitance of the variable capacitance circuit VCP1 is controlled by the control voltage LPQ. The D/A conversion circuit 61 and the low-pass filter 62 are so provided as to be common to the variable capacitance circuits VCP1 to VCP5.

6. Variation of Control Circuits

Figure 12:
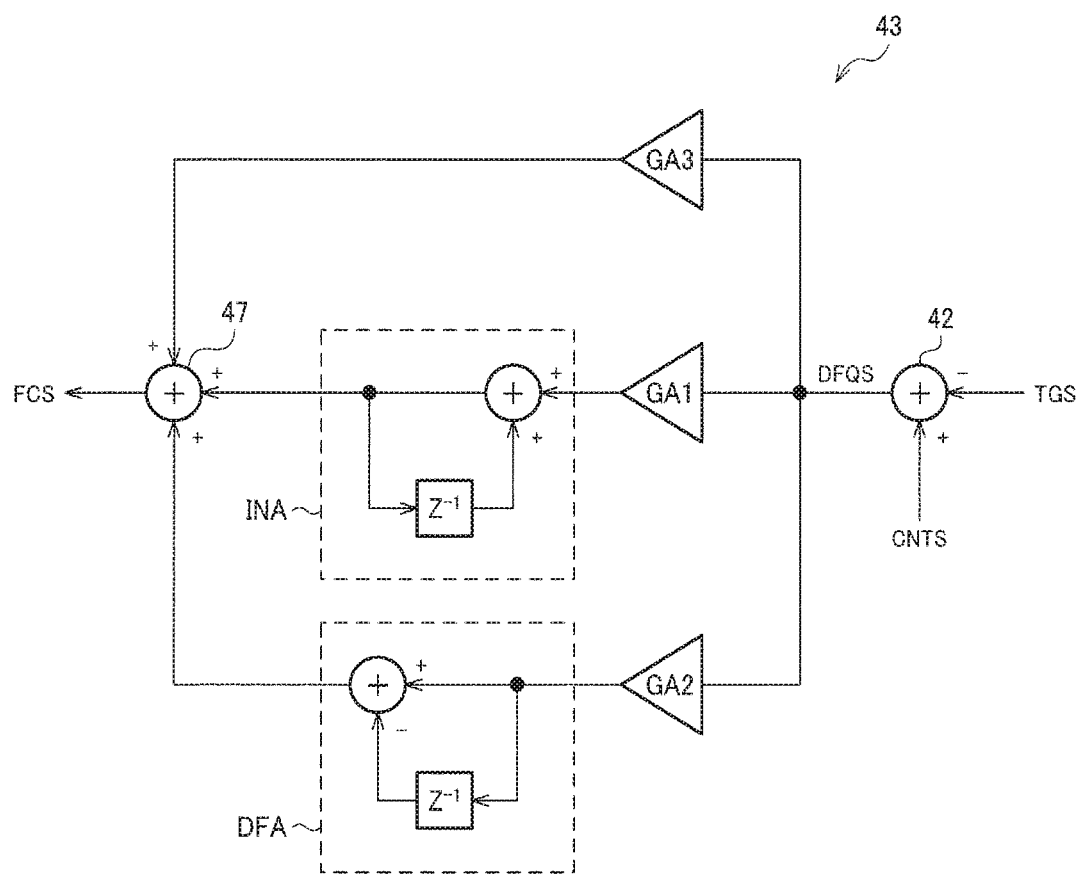
FIG. 12 shows a variation of a control circuit.

FIG. 12 shows a variation of the control circuits. FIG. 12 shows an example of the configuration of the control circuits in a case where the PID control is performed on the oscillation frequencies. In FIG. 12, the description will be made with reference to the control circuit 43, and the control circuit 53 has the same configuration. That is, in the case of the control circuit 53, the difference value DFQS and the control data FCS may be replaced with the difference value DFQF and the control data FCF, respectively, in FIG. 12.

The control circuit 43 includes gain multiplication circuits GA1 to GA3, an integrator INA, a differentiator DFA, and an adder 47. The gain multiplication circuit GA1 multiplies the difference value DFQS by a first gain. Similarly, the gain multiplication circuits GA2 and GA3 multiply the difference value DFQS by the gain second and a third gain. The integrator INA integrates the output value from the gain multiplication circuit GA1. The differentiator DFA differentiates the output value from the gain multiplication circuit GA2. The adder 47 adds the output value from the integrator INA, the output value from the differentiator DFA, and the output value from the gain multiplication circuit GA3 to one another and outputs the control data FCS.

7. Circuit Device, Physical Quantity Measurement Apparatus

Figure 13:
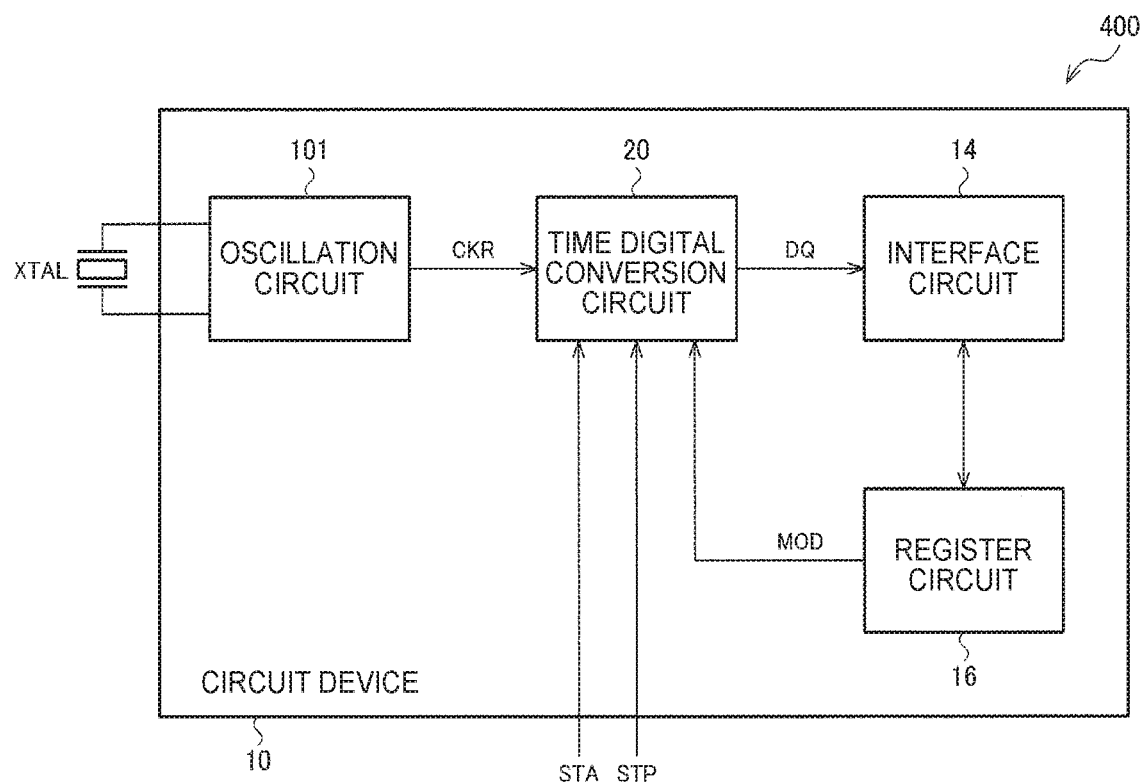
FIG. 13 shows examples of the configurations of a circuit device including the time-to-digital converter and a physical quantity measurement apparatus including the circuit device.

FIG. 13 shows examples of the configurations of a circuit device including the time-to-digital converter and a physical quantity measurement apparatus including the circuit device. A physical quantity measurement apparatus 400 includes an oscillator XTAL and the circuit device 10.

The oscillator XTAL is, for example, a piezoelectric resonator. Specifically, the oscillator is, for example, a quartz crystal resonator. An example of the quartz crystal resonator is, for example, a quartz crystal resonator that undergoes thickness slide resonance, such as a quartz crystal resonator cut at an AT cut angle or an SC cut angle. For example, the oscillator may be a resonator built in an oven controlled crystal oscillator (OCXO) including an oven, a resonator built in a temperature compensated crystal oscillator (TCXO) including no oven, or a resonator built in a simple package crystal oscillator (SPXO). The oscillator may instead, for example, be a surface acoustic wave (SAW) resonator or a MEMS (micro electro mechanical systems) resonator in the form of a silicon resonator formed by using a silicon substrate.

The circuit device 10 is formed, for example, of an integrated circuit device (semiconductor circuit device). The circuit device 10 includes an oscillation circuit 101, the time-to-digital converter 20, an interface circuit 14, and a register circuit 16. The configuration of the circuit device does not necessarily have the configuration shown in FIG. 13. For example, the oscillation circuit 101 may be a circuit external to the circuit device. That is, the oscillator XTAL and the oscillation circuit 101 may be configured as an oscillator, and the reference clock signal CKR from the oscillator may be inputted to the circuit device.

The oscillation circuit 101 uses the oscillator XTAL to generate the reference clock signal CKR having the clock frequency fr (reference clock frequency). Specifically, the oscillation circuit 101 causes the oscillator XTAL to oscillate to generate an oscillation signal and generates the reference clock signal CKR based on the oscillation signal. For example, the oscillation circuit 101 buffers the oscillation signal and outputs the reference clock signal CKR. The oscillation circuit 101 instead divides the oscillation signal and outputs the reference clock signal CKR. The oscillation circuit 101 is, for example, a pierce-type oscillation circuit in which an oscillator is connected to a feedback loop between the base and the emitter or the collector and the base of a bipolar transistor. The oscillation circuit 101 is instead an oscillation circuit in which an oscillator is connected to a feedback loop between the input and the output of an odd number of inverters (logic inversion circuits).

The time-to-digital converter 20 uses the reference clock signal CKR to adjust the clock frequencies f1 and f2 of the clock signals CLKS and CLKF and uses the clock signals CLKS and CLKF to convert the time difference between the transition timing of the signal STA and the transition timing of the signal STP into the digital value DQ.

The time difference between the transition timings of the signals STA and STP is the inter-edge time difference between the signals STA and STP (between rising or falling edges, for example). For example, in a time-of-flight (TOF) distance measurement apparatus, the signal level of the signal STA transitions at the timing when a light emitter emits radiated light (laser beam, for example) to a target object (object around car, for example), and the signal level of the signal STP transitions at the timing when a light receiver receives the light reflected off the target object. For example, the signal STP is produced by shaping the waveform of a light reception signal. The distance to the target object can therefore be measured as a physical quantity and can be used, for example, to automatically drive a car or control the action of a robot.

Instead, in an ultrasonic measurement apparatus, the signal level of the signal STA transitions at the timing when a probe transmits a transmission sound wave (ultrasonic wave, for example) to a target object (living body, for example), and the signal level of the signal STP transitions at the timing when the probe receives a reception sound wave from the target object. The signal STP is produced, for example, by shaping the waveform of the reception sound wave. The distance to the target object or any other factor can therefore be measured as a physical quantity, and the ultrasonic wave can be used to, for example, measure biological information.

The interface circuit 14 performs communication between the circuit device 10 and an external apparatus (processing device, for example). The interface circuit 14 is formed, for example, of a serial interface circuit that complies with an SPI scheme or an I2C scheme. The interface circuit 14 transmits the digital value DQ of the time measured by the time-to-digital converter 20 to an apparatus external to the circuit device 10. The interface circuit 14 receives a variety of pieces of setting information (mode setting signal MOD, for example) for setting the action of the circuit device 10 from an apparatus external to the circuit device 10. The setting information is written, for example, to the register circuit 16.

Figure 14:
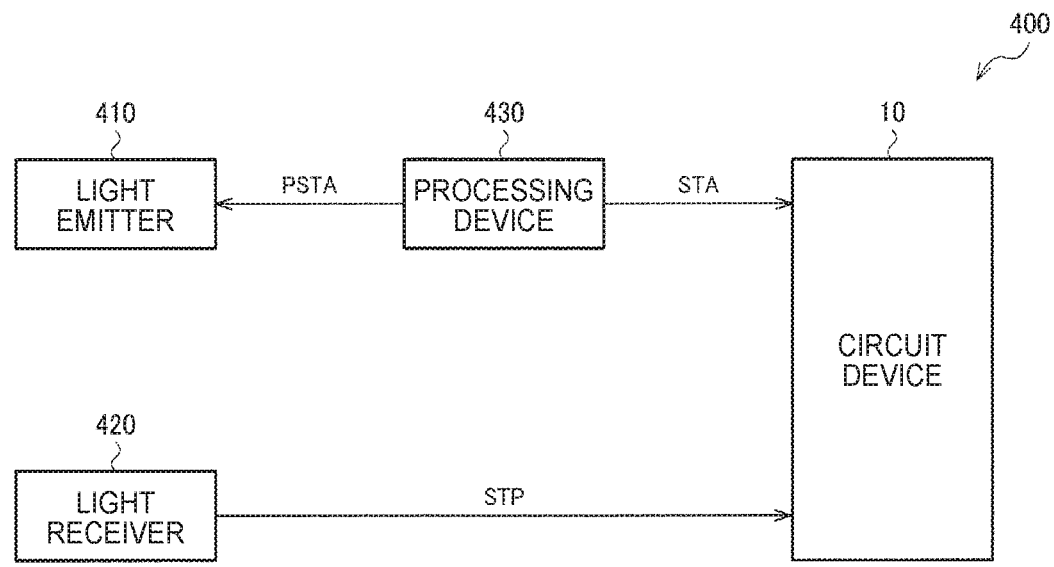
FIG. 14 shows a second example of the configuration of the physical quantity measurement apparatus.

FIG. 14 shows a second example of the configuration of the physical quantity measurement apparatus. The physical quantity measurement apparatus 400 shown in FIG. 14 includes a light emitter 410 (light source), a processing device 430 (processor, for example, CPU), which outputs a light emission control signal PSTA to the light emitter 410, a light receiver 420 (light receiving sensor), which receives light reflected off a target object, and the circuit device 10.

The light emitter 410 emits light based on the light emission control signal PSTA from the processing device 430, the light emission control signal PSTA is inputted as the signal STA to the circuit device 10, and a light reception signal from the light receiver 420 is inputted as the signal STP to the circuit device 10. A TOF-type distance measurement apparatus that measures the distance to a target object as a physical quantity can therefore be achieved. The processing device 430 may be provided as a device external to the physical quantity measurement apparatus 400, and the light emission control signal PSTA (signal STA) may be inputted from the external processing device 430 to the physical quantity measurement apparatus 400.

8. Electronic Instrument, Vehicle

Figure 15:
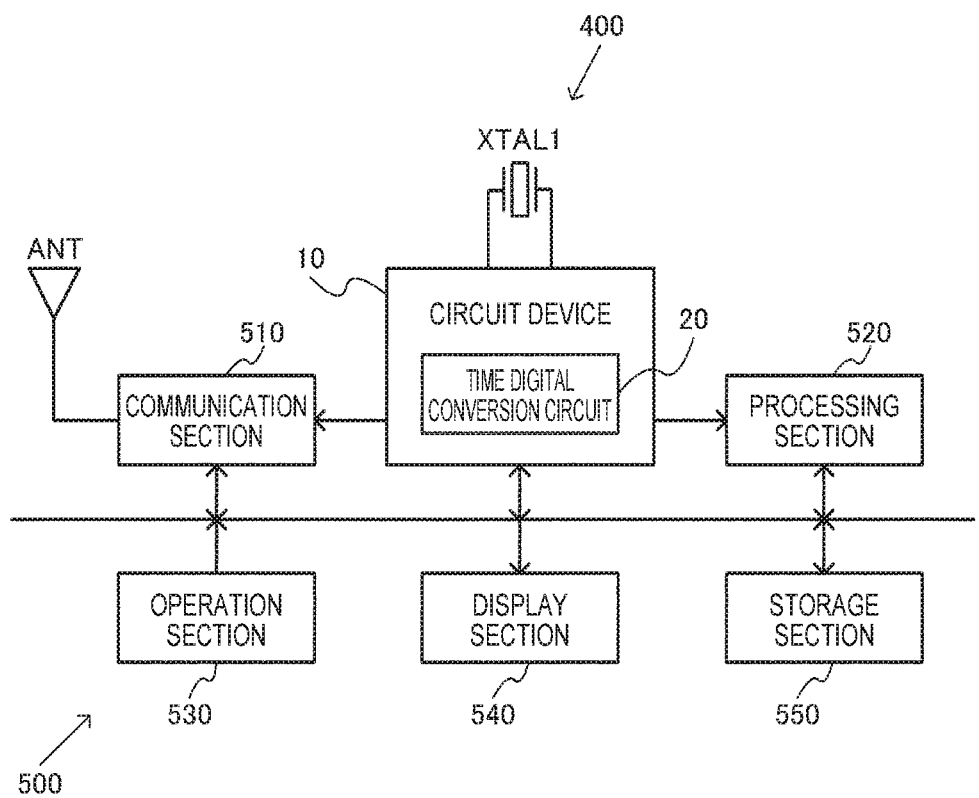
FIG. 15 shows an example of the configuration of an electronic instrument.

FIG. 15 shows an example of the configuration of an electronic instrument including the time-to-digital converter (circuit device, physical quantity measurement apparatus) according to the present embodiment. An electronic instrument 500 includes the physical quantity measurement apparatus 400, which includes the circuit device 10 and the oscillator XTAL, and a processing section 520. The electronic instrument 500 can further include a communication section 510, an operation section 530, a display section 540, a storage section 550, and an antenna ANT.

Conceivable examples of the electronic instrument 500 may include a measurement instrument that measures a distance, time, a flow speed, a flow rate, or any other physical quantity, a biological information measurement instrument that measures biological information (such as ultrasonic measurement apparatus, pulse wave meter, blood pressure measurement apparatus), an in-vehicle instrument (such as instrument for automatic driving), a network-related instrument, such as a base station and a router. Other conceivable examples of the electronic instrument 500 may include a head mounted display, a timepiece-related instrument, or any other wearable instrument, a robot, a printer, a projector, a mobile information terminal (such as smartphone), a content provider that distributes contents, or a digital camera, a video camcorder, or any other video instrument.

The communication section 510 (wireless communication circuit) receives data from an external apparatus via the antenna ANT and transmits data to the external apparatus. The processing section 520 (processing circuit) controls the electronic instrument 500 and performs a variety of types of digital processing on the data transmitted and received via the communication section 510. The function of the processing section 520 can be achieved, for example, by a processor, such as a microcomputer. The operation section 530 allows a user to perform input operation and can be achieved by operation buttons, a touch panel display, or any other component. The display section 540 displays a variety of pieces of information and can be achieved by a display based on liquid crystal, organic EL, or any other technology. The storage section 550 stores data, and the function of the storage section 550 can be achieved by a RAM, a ROM, or any other semiconductor memory, a hard disk drive (HDD), or any other component.

Figure 16:
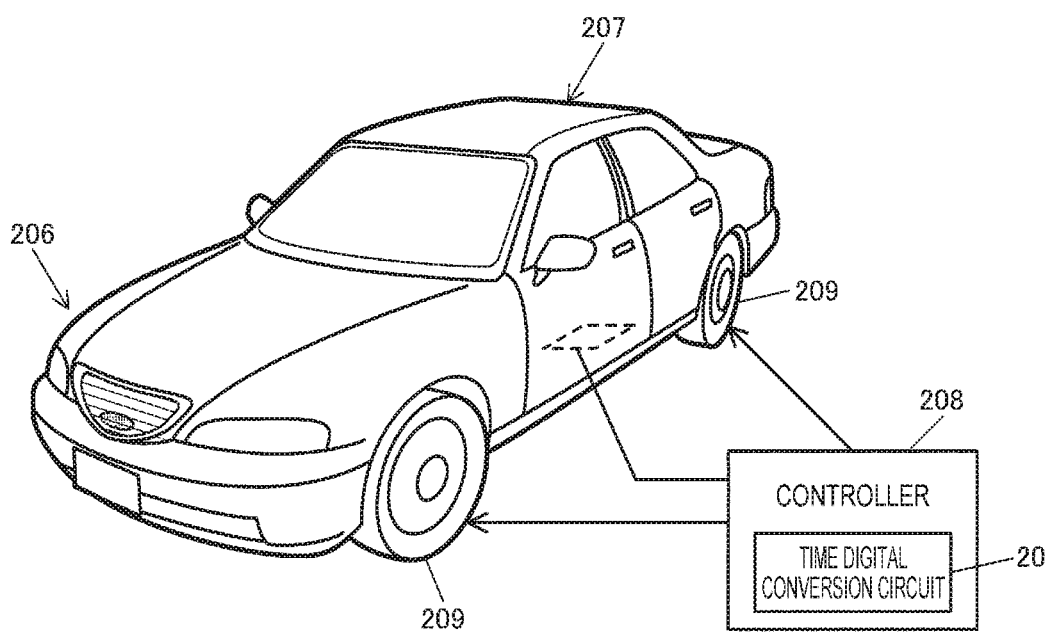
FIG. 16 shows an example of a vehicle.

FIG. 16 shows an example of a vehicle including the time-to-digital converter (circuit device, physical quantity measurement apparatus) according to the present embodiment. The time-to-digital converter (circuit device, physical quantity measurement apparatus) according to the present embodiment can be incorporated, for example, in a variety of vehicles, such as a car, an airplane, a motorcycle, a bicycle, a robot, or a ship. The vehicle is an instrument/apparatus that includes, for example, a drive mechanism, such as an engine and a motor, a steering mechanism, such a steering wheel and a rudder, and a variety of electronic instruments (in-vehicle instruments) and moves on the ground, in the sky, or on the sea. FIG. 16 schematically shows an automobile 206 as a specific example of the vehicle. The automobile 206 incorporates the physical quantity measurement apparatus (not shown) including the time-to-digital converter 20 according to the present embodiment. A controller 208 performs a variety of types of control based on physical quantity information measured by the physical quantity measurement apparatus. For example, in a case where information on the distance to an object around the automobile 206 is measured as the physical quantity information, the controller 208 uses the measured distance information to perform a variety of types of control for automatic driving. The controller 208, for example, controls the degree of hardness of the suspension in accordance with the attitude of a vehicle body 207 and performs braking control on individual wheels 209. An instrument that incorporates the time-to-digital converter (circuit device, physical quantity measurement apparatus) according to the present embodiment is not limited to the controller 208, and the time-to-digital converter 20 can be incorporated in a variety of instruments provided in a vehicle, such as the automobile 206 and a robot.

The present embodiment has been described above in detail, and a person skilled in the art will readily appreciate that a large number of variations are conceivable to the extent that they do not substantially depart from the novel items and advantageous effects of the invention. Such variations are all therefore intended to fall within the scope of the invention. For example, a term described at least once in the specification or the drawings along with a different term having a boarder meaning or the same meaning can be replaced with the different term anywhere in the specification or the drawings. Further, all combinations of the present embodiment and the variations fall within the scope of the invention. Moreover, the configuration, action, and other factors of each of the time-to-digital converter, the circuit device, the electronic instrument, or the vehicle are not limited to those described in the present embodiment, and a variety of changes can be made thereto.

The entire disclosure of Japanese Patent Application No. 2017-163935, filed Aug. 29, 2017 is expressly incorporated by reference herein.

What is claimed is:

1. A time-to-digital converter comprising:
   a first oscillation circuit that starts oscillating at a transition timing of a first signal and generates a first clock signal having a first clock frequency;
   a second oscillation circuit that starts oscillating at a transition timing of a second signal and generates a second clock signal having a second clock frequency different from the first clock frequency;
   a first adjustment circuit that measures the first clock frequency based on a reference clock signal and adjusts an oscillation frequency of the first oscillation circuit in such a way that the first clock frequency is equal to a first target frequency;
   a second adjustment circuit that measures the second clock frequency based on the reference clock signal and adjusts an oscillation frequency of the second oscillation circuit in such a way that the second clock frequency is equal to a second target frequency; and
   a processing circuit that converts a time difference between the transition timing of the first signal and the transition timing of the second signal into a digital value based on the first and second clock signals.

2. The time-to-digital converter according to claim 1, wherein the first adjustment circuit includes
   a first measurement circuit that measures the first clock frequency based on the reference clock signal,
   a first comparison circuit that compares the first clock frequency measured by the first measurement circuit with the first target frequency, and
   a first control circuit that outputs first control data that controls the oscillation frequency of the first oscillation circuit based on a result of the comparison performed by the first comparison circuit, and
   the second adjustment circuit includes
   a second measurement circuit that measures the second clock frequency based on the reference clock signal,
   a second comparison circuit that compares the second clock frequency measured by the second measurement circuit with the second target frequency, and
   a second control circuit that outputs second control data that controls the oscillation frequency of the second oscillation circuit based on a result of the comparison performed by the second comparison circuit.

3. The time-to-digital converter according to claim 1, further comprising:
   a first selector that selects the first signal or an adjustment enable signal; and
   a second selector that selects the second signal or the adjustment enable signal,
   wherein in a first mode,
      the first selector selects the adjustment enable signal and outputs the adjustment enable signal to the first oscillation circuit, the first adjustment circuit adjusts the oscillation frequency of the first oscillation circuit having started oscillating in response to the adjustment enable signal, the second selector selects the adjustment enable signal and outputs the adjustment enable signal to the second oscillation circuit, and the second adjustment circuit adjusts the oscillation frequency of the second oscillation circuit having started oscillating in response to the adjustment enable signal,
   in a second mode,
      the first selector selects the first signal and outputs the first signal to the first oscillation circuit, the first oscillation circuit to which the first signal has been inputted starts oscillating at the transition timing of the first signal to generate the first clock signal, the second selector selects the second signal and outputs the second signal to the second oscillation circuit, and the second oscillation circuit to which the second signal has been inputted starts oscillating at the transition timing of the second signal to generate the second clock signal, and
   the processing circuit converts the time difference into the digital value based on the first and second clock signals.

4. The time-to-digital converter according to claim 3, further comprising
 a reference clock counter that counts the number of clocks of the reference clock signal and outputs an enable signal that becomes active in a count enable period that is a period for which a given number of clocks is counted,
 wherein the first adjustment circuit includes a first measurement circuit that counts the number of clocks of the first clock signal in the count enable period based on the enable signal and outputs a first clock count, and
 the second adjustment circuit includes a second measurement circuit that counts the number of clocks of the second clock signal in the count enable period based on the enable signal and outputs a second clock count.

5. The time-to-digital converter according to claim 4, wherein the first adjustment circuit includes
 a first comparison circuit that determines a value of a difference between the first clock count and a first target count corresponding to the first target frequency and outputs a first difference value, and
 a first control circuit that includes a first integrator that integrates the first difference value and outputs a first integrated value, and the first control circuit outputting first control data that controls the oscillation frequency of the first oscillation circuit based on the first integrated value, and
 the second adjustment circuit includes
 a second comparison circuit that determines a value of a difference between the second clock count and a second target count corresponding to the second target frequency and outputs a second difference value, and
 a second control circuit that includes a second integrator that integrates the second difference value and outputs a second integrated value, and the second control circuit outputting second control data that controls the oscillation frequency of the second oscillation circuit based on the second integrated value.

6. The time-to-digital converter according to claim 1, further comprising:
 a first replicated oscillation circuit that is a circuit that replicates the first oscillation circuit and generates a first replicated clock signal, and
 a second replicated oscillation circuit that is a circuit that replicates the second oscillation circuit and generates a second replicated clock signal,
 wherein the first adjustment circuit measures a frequency of the first replicated clock signal based on the reference clock signal to measure the first clock frequency and adjusts an oscillation frequency of the first replicated oscillation circuit in such a way that the frequency of the first replicated clock signal is equal to the first target frequency, and
 the second adjustment circuit measures a frequency of the second replicated clock signal based on the reference clock signal to measure the second clock frequency and adjusts an oscillation frequency of the second replicated oscillation circuit in such a way that the frequency of the second replicated clock signal is equal to the second target frequency.

7. The time-to-digital converter according to claim 6, wherein the first adjustment circuit stops updating first control data that controls the oscillation frequency of the first replicated oscillation circuit in a measurement period in which the time difference is measured, and
 the second adjustment circuit stops updating second control data that controls the oscillation frequency of the second replicated oscillation circuit in the measurement period.

8. The time-to-digital converter according to claim 6, further comprising
 a reference clock counter that counts the number of clocks of the reference clock signal and outputs an enable signal that becomes active in a count enable period that is a period for which a given number of clocks is counted,
 wherein the first adjustment circuit includes a first measurement circuit that counts the number of clocks of the first replicated clock signal in the count enable period based on the enable signal and outputs a first clock count, and
 the second adjustment circuit includes a second measurement circuit that counts the number of clocks of the second replicated clock signal in the count enable period based on the enable signal and outputs a second clock count.

9. The time-to-digital converter according to claim 8, wherein the first adjustment circuit includes
 a first comparison circuit that determines a value of a difference between the first clock count and a first target count corresponding to the first target frequency and outputs a first difference value, and
 a first control circuit that includes a first integrator that integrates the first difference value and outputs a first integrated value, and the first control circuit outputting first control data that controls the oscillation frequencies of the first oscillation circuit and the first replicated oscillation circuit based on the first integrated value, and
 the second adjustment circuit includes
 a second comparison circuit that determines a value of a difference between the second clock count and a second target count corresponding to the second target frequency and outputs a second difference value, and
 a second control circuit that includes a second integrator that integrates the second difference value and outputs a second integrated value, and the second control circuit outputting second control data that controls the oscillation frequencies of the second oscillation circuit and the second replicated oscillation circuit based on the second integrated value.

10. The time-to-digital converter according to claim 1, wherein the processing circuit includes
 a phase comparison circuit that compares the first clock signal with the second clock signal in terms of phase,
 a first counter that counts the number of clocks of the first clock signal and outputs a first count,
 a second counter that counts the number of clocks of the second clock signal and outputs a second count, and
 a calculation circuit that determines the digital value based on the first and second counts.

11. The time-to-digital converter according to claim 10, wherein the calculation circuit determines a resolution of time measurement based on the first clock frequency measured by the first adjustment circuit and the second clock frequency measured by the second adjustment circuit and uses the resolution to determine the digital value.

12. A circuit device comprising the time-to-digital converter according to claim 1.

13. A circuit device comprising the time-to-digital converter according to claim 2.

14. A circuit device comprising:
the time-to-digital converter according to claim 3; and
an interface circuit that receives a mode setting signal that sets a mode in which time measurement is performed,
wherein the time-to-digital converter transitions from the first mode to the second mode based on the mode setting signal.

15. A circuit device comprising:
the time-to-digital converter according to claim 4; and
an interface circuit that receives a mode setting signal that sets a mode in which time measurement is performed,
wherein the time-to-digital converter transitions from the first mode to the second mode based on the mode setting signal.

16. A physical quantity measurement apparatus comprising the time-to-digital converter according to claim 1.

17. A physical quantity measurement apparatus comprising the time-to-digital converter according to claim 2.

18. An electronic instrument comprising the time-to-digital converter according to claim 1.

19. An electronic instrument comprising the time-to-digital converter according to claim 2.

20. A vehicle comprising the time-to-digital converter according to claim 1.

\* \* \* \* \*